US011552270B2

(12) United States Patent
Sim et al.

(10) Patent No.: US 11,552,270 B2
(45) Date of Patent: Jan. 10, 2023

(54) LIGHT EMITTING DISPLAY APPARATUS HAVING IMPROVED LIGHT EXTRACTION AND COLOR GAMUT

(71) Applicant: LG Display Co., Ltd., Seoul (KR)

(72) Inventors: Dongmin Sim, Paju-si (KR); Hyekyung Choi, Seoul (KR); Wonhoe Koo, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/006,475

(22) Filed: Aug. 28, 2020

(65) Prior Publication Data

US 2021/0159445 A1 May 27, 2021

(30) Foreign Application Priority Data

Nov. 26, 2019 (KR) .................. 10-2019-0152920

(51) Int. Cl.
*H01L 51/52* (2006.01)
*H01L 27/32* (2006.01)

(52) U.S. Cl.
CPC ...... *H01L 51/5218* (2013.01); *H01L 27/3211* (2013.01); *H01L 27/3246* (2013.01); *H01L 27/3258* (2013.01); *H01L 51/5265* (2013.01); *H01L 51/5271* (2013.01); *H01L 2251/5315* (2013.01)

(58) Field of Classification Search
CPC ............ H01L 51/5218; H01L 27/3211; H01L 27/3246; H01L 27/3258; H01L 51/5265; H01L 51/5271; H01L 2251/5315
USPC ........................................................ 257/89
See application file for complete search history.

(56) References Cited

U.S. PATENT DOCUMENTS

| 9,536,931 B2 | 1/2017 | Kim et al. |
| 2004/0222740 A1* | 11/2004 | Kim ............... H01L 51/5228 313/506 |
| 2006/0091399 A1* | 5/2006 | Lee ................. H01L 27/12 257/E27.111 |
| 2014/0239259 A1* | 8/2014 | Lim ............... H01L 51/5262 257/40 |
| 2016/0268319 A1* | 9/2016 | Long .............. H01L 27/1255 |
| 2019/0165072 A1* | 5/2019 | Wang ............. H01L 51/0097 |

FOREIGN PATENT DOCUMENTS

KR 10-2013-0085195 A 7/2013

* cited by examiner

*Primary Examiner* — Xia L Cross
(74) *Attorney, Agent, or Firm* — Birch, Stewart, Kolasch & Birch, LLP

(57) ABSTRACT

A light emitting display apparatus includes a substrate including a plurality of sub-pixels; an overcoating layer on the substrate and having a base portion and a protrusion portion; a first electrode disposed to cover a side portion of the protrusion portion and the base portion at the plurality of sub-pixels; a bank layer covering a portion of the first electrode and the overcoating layer; and a light emitting layer and a second electrode on the first electrode and the bank layer at the plurality of sub-pixels. The first electrode includes a reflective layer and a transparent conductive layer on the reflective layer, the transparent conductive layer includes a first portion on the base portion and a second portion on a side surface of the protrusion portion, and a thickness of the second portion is greater than a thickness of the first portion.

21 Claims, 10 Drawing Sheets

LIGHT EMITTING DISPLAY APPARATUS HAVING IMPROVED LIGHT EXTRACTION AND COLOR GAMUT

CROSS-REFERENCE TO RELATED APPLICATIONS

This application claims priority to Korean Patent Application No. 10-2019-0152920 filed on Nov. 26, 2019 with the Korean Intellectual Property Office, the disclosure of which is hereby expressly incorporated herein by reference into the present application.

BACKGROUND

Technical Field

The present disclosure relates to a light emitting display apparatus and more particularly, to a light emitting display apparatus capable of improving light extraction efficiency and at the same time, improving color gamut by inhibiting a change in color coordinates.

Discussion of the Related Art

Recently, as our society advances toward an information-oriented society, the field of display apparatuses for visually expressing electrical information signals has rapidly advanced. Various display apparatuses, having excellent performance in terms of thinness, lightness, and low power consumption, are being developed correspondingly.

Among these various display apparatuses, a light emitting display apparatus is a self-light emitting display apparatus, and can be manufactured to be light and thin since it does not require a separate light source, unlike a liquid crystal display apparatus having a separate light source. In addition, the light emitting display apparatus has advantages in terms of power consumption due to a low voltage driving, and is excellent in terms of a color implementation, a response speed, a viewing angle, and a contrast ratio (CR). Therefore, light emitting display apparatuses are expected to be utilized in various fields.

SUMMARY

Light emitted from a light emitting layer of a light emitting display apparatus can be output to the outside of the light emitting display apparatus through various components of the light emitting display apparatus. However, in the light emitted from the light emitting layer, there exists light trapped inside the light emitting display apparatus without coming out of the light emitting display apparatus, whereby light extraction efficiency of the light emitting display apparatus can be problematic.

For example, there is a limitation in which some of the light emitted from the light emitting layer is trapped inside the light emitting display apparatus due to losses in total reflection, optical waveguide, and surface plasmon. Here, the loss in total reflection refers to a degradation in light extraction efficiency due to the light trapped inside the light emitting display apparatus, of the light emitted from the light emitting layer, by total reflection at an interface between a substrate and the air. The loss in optical waveguide refers to a degradation in light extraction efficiency due to the light trapped inside by total reflection at an interface of components inside the light emitting display apparatus. The loss in surface plasmon refers to a situation when light vibrates free electrons of a metal surface due to a phenomenon in which light present on the metal surface is absorbed into metal during light incidence and propagation, whereby the reflection or transmission of the light is prevented to thereby result in a degradation in light extracting efficiency.

To address these limitations, the inventors of the present disclosure have invented a light emitting display apparatus having a new structure to improve light extraction efficiency of the light emitting display apparatus by reducing losses in total reflection and optical waveguide. For example, the inventors of the present disclosure form an overcoating layer to have a base portion having a planar upper surface and a protrusion portion protruding from the base portion, and to dispose an anode having a reflective layer on a side portion of the protrusion portion and the base portion. Accordingly, the reflective layer of the anode formed on the side portion of the protrusion portion can function as a side mirror, and some of the light trapped inside the light emitting display apparatus by total reflection is extracted in a front direction of the light emitting display apparatus, whereby light extraction efficiency of the light emitting display apparatus is improved.

However, the inventors of the present disclosure have recognized that light additionally extracted from the light emitting display apparatus having a structure described above may cause a change in color coordinates, which may be an issue.

For example, when a reflective electrode is disposed on a side portion of a protrusion portion of the light emitting display apparatus, light is extracted upwardly of the light emitting display apparatus in a non-light emitting area, thereby contributing to improvements in light extraction efficiency. However, light extracted upwardly of the light emitting display apparatus by being reflected from the reflective electrode disposed in the non-light emitting area exhibits a photoluminescence (PL) spectrum. Accordingly, additionally extracted light can increase greater in a long wavelength region than in a short wavelength region. Thus, a sub-pixel that emits light of a short wavelength range, such as a blue sub-pixel, can have a problem in which a color coordinate change can occur.

Accordingly, the inventors of the present disclosure have invented an improved light emitting display apparatus having a novel structure, capable of preventing or minimizing a change in color coordinates, while improving light extraction efficiency.

An aspect of the present disclosure is to provide a light emitting display apparatus capable of minimizing generation of light in a long wavelength region that can occur when using an anode having a side mirror shape.

Another aspect of the present disclosure is to reduce a change in color coordinates of extracted light.

Additional features and aspects will be set forth in the description that follows, and in part will be apparent from the description, or can be learned by practice of the inventive concepts provided herein. Other features and aspects of the inventive concepts can be realized and attained by the structure particularly pointed out in the written description, or derivable therefrom, and the claims hereof as well as the appended drawings.

According to an aspect of the present disclosure, a light emitting display apparatus can include a substrate including a plurality of sub-pixels; an overcoating layer on the substrate and having a base portion and a protrusion portion; a first electrode disposed to cover a side portion of the protrusion portion and the base portion at the plurality of sub-pixels; a bank layer covering a portion of the first electrode and the overcoating layer; and a light emitting layer and a second electrode on the first electrode and the bank layer at the plurality of sub-pixels, wherein the first electrode includes a reflective layer and a transparent conductive layer on the reflective layer, and the transparent conductive layer includes a first portion on the base portion and a second portion on a side surface of the protrusion portion, and wherein a thickness of the second portion is greater than a thickness of the first portion.

According to another aspect of the present disclosure, a light emitting display apparatus can include a substrate having a plurality of sub-pixels, the plurality of sub-pixels including a light emitting area and a non-light emitting area; an overcoating layer having a protrusion portion protruding from the non-light emitting area; a light emitting element including a first electrode being in contact with the protrusion portion, a second electrode, and a light emitting layer at the light emitting area between the first electrode and the second electrode; and a bank layer covering a portion of the first electrode and the protrusion portion, wherein the first electrode includes a reflective layer and a transparent conductive layer on the reflective layer, the transparent conductive layer includes a first transparent conductive layer at the light emitting area and a second transparent conductive layer on the protrusion portion at the non-light emitting area, and a thickness of the second transparent conductive layer is greater than a thickness of the first transparent conductive layer.

According to another aspect of the present disclosure, a light emitting display apparatus can include an overcoating layer on a substrate and having a base portion and a protrusion portion protruding from the base portion, a first electrode disposed to cover a side portion of the protrusion portion and the base portion, the first electrode includes a reflective layer and a transparent conductive layer on the reflective layer, a bank layer covering a portion of the first electrode and the overcoating layer, and a light emitting layer and a second electrode on the first electrode and the bank layer.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

According to an exemplary embodiment of the present disclosure, light extraction efficiency of the light emitting display apparatus can be improved by using an anode having a side mirror shape.

According to an exemplary embodiment of the present disclosure, a thickness of an anode is differently set in a light emitting area and a non-light emitting area to thereby inhibit a change in color coordinates due to additionally extracted light that contributes to improvements in light efficiency, so that color gamut can be improved.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, that can be included to provide a further understanding of the disclosure and are incorporated in and constitute a part of this specification, illustrate embodiments of the disclosure and together with the description serve to explain various principles of the disclosure.

DETAILED DESCRIPTION OF THE EMBODIMENTS

Figure 1:
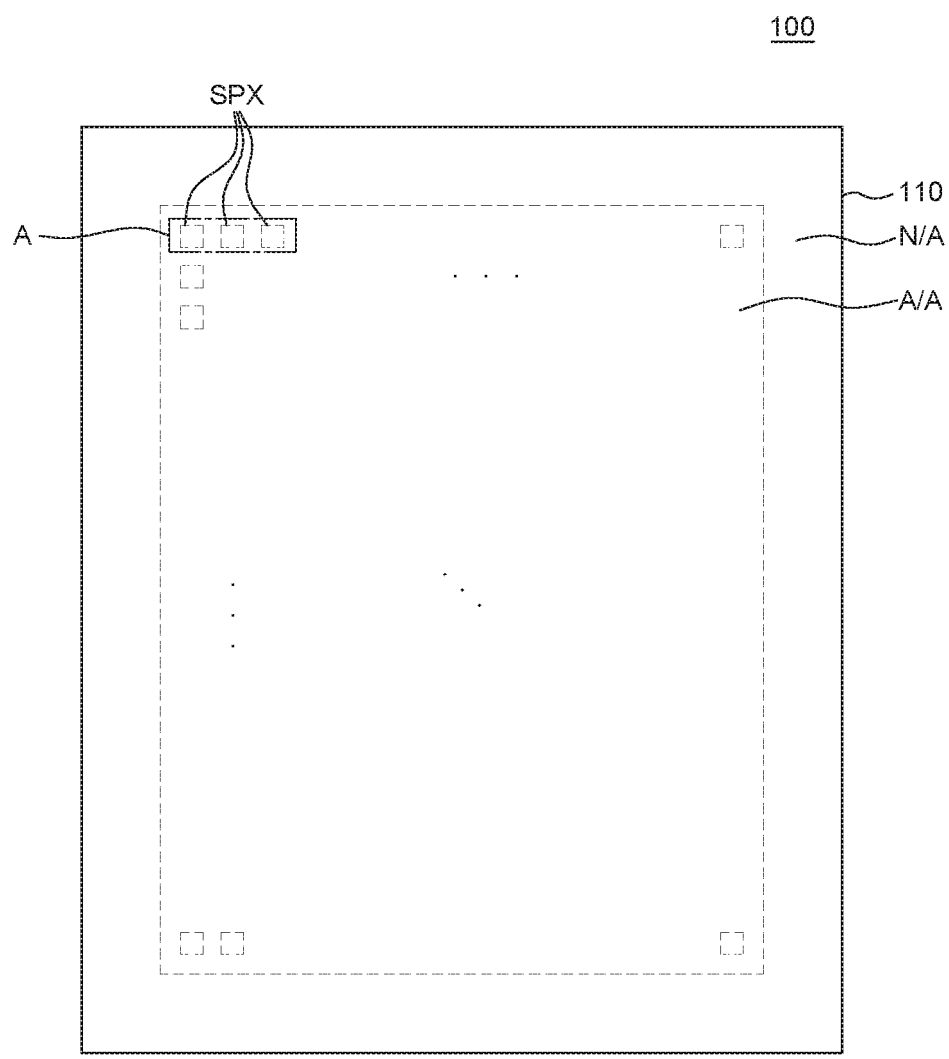
FIG. 1 is a plan view of a light emitting display apparatus according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "comprising" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms and may not define any order. These terms are merely used for distinguishing one component from the other components. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, exemplary embodiments of the present disclosure will be described in detail with reference to accompanying drawings.

Figure 2:
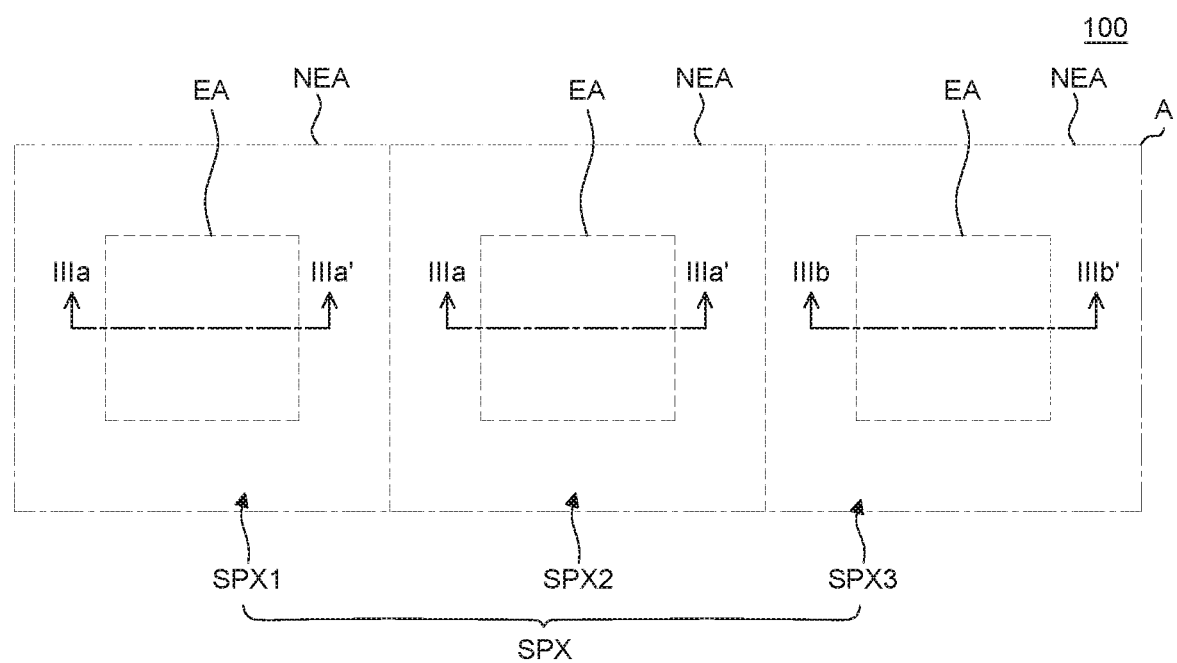
FIG. 2 is an enlarged plan view of region A of FIG. 1.
Figure 3A:
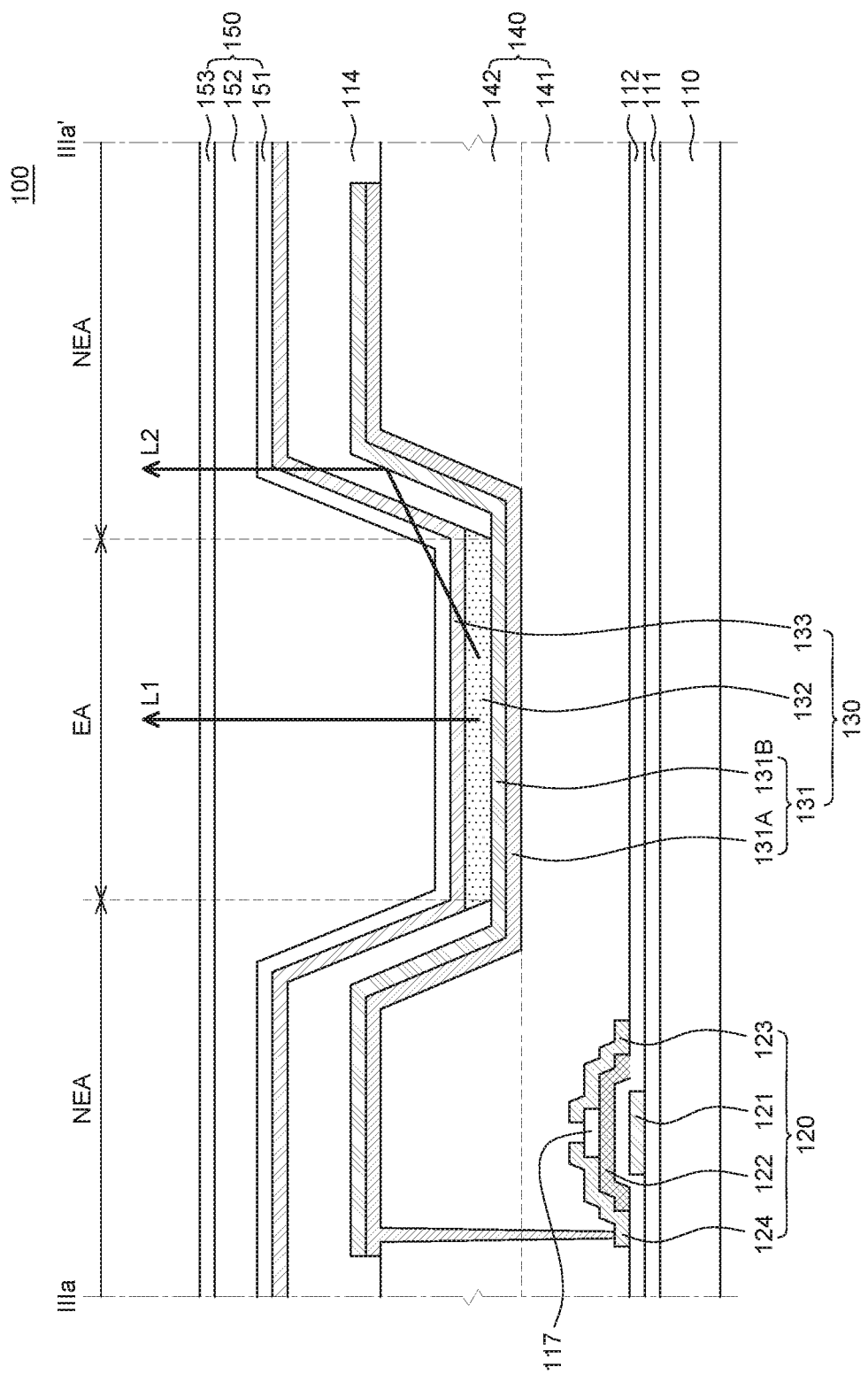
FIG. 3A is a cross-sectional view of the light emitting display apparatus, taken along line IIIa-IIIa' of FIG. 2.
Figure 3B:
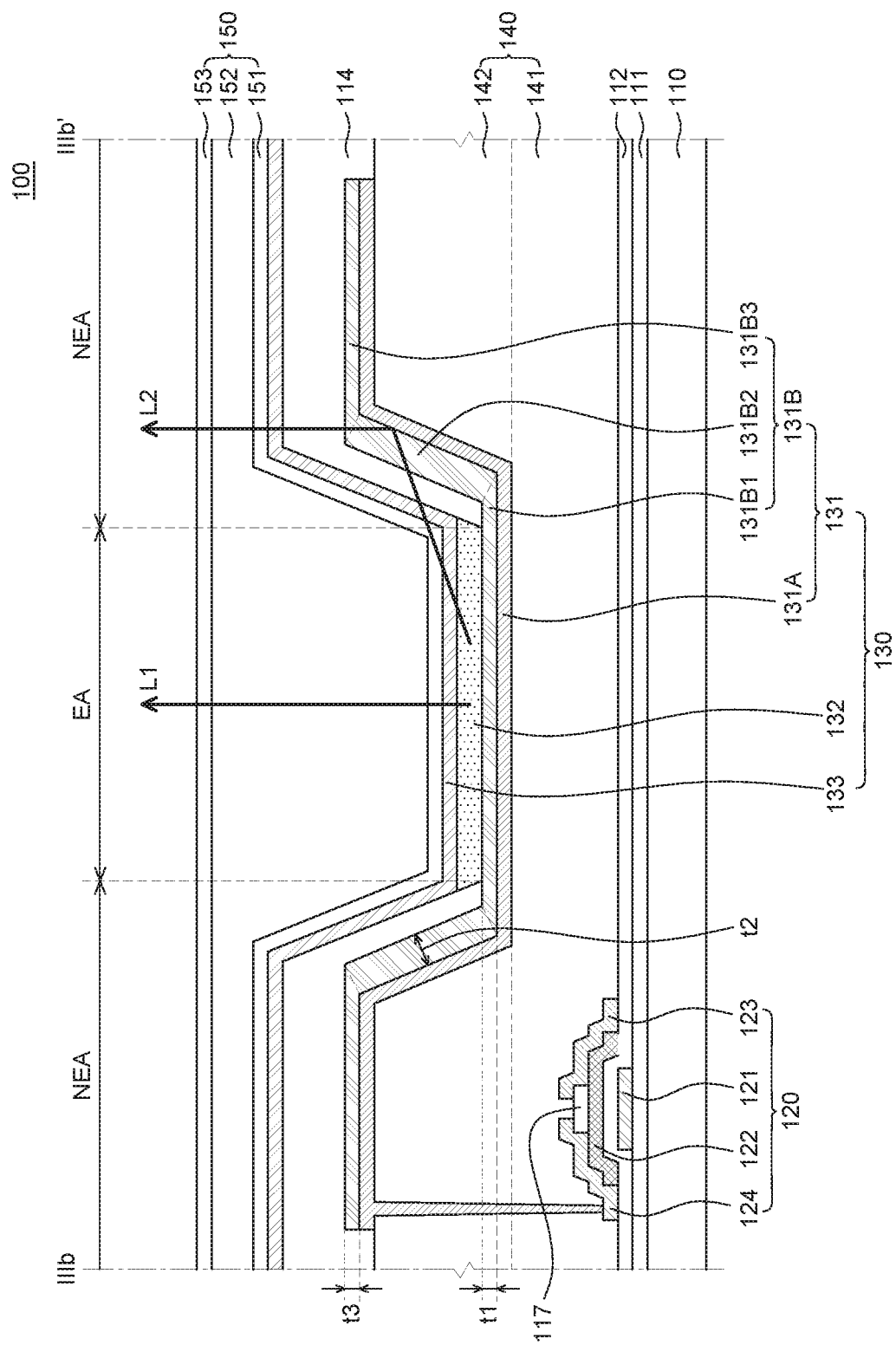
FIG. 3B is a cross-sectional view of the light emitting display apparatus, taken along line of FIG. 2.

FIG. 1 is a plan view of a light emitting display apparatus according to an exemplary embodiment of the present disclosure. FIG. 2 is an enlarged plan view of region A of FIG. 1. FIG. 3A is a cross-sectional view of the light emitting display apparatus, taken along line IIIa-IIIa' of FIG. 2. FIG. 3B is a cross-sectional view of the light emitting display apparatus, taken along line IIIb-IIIb' of FIG. 2.

In FIG. 2, only a plurality of sub-pixels SPX are illustrated for convenience of description. In addition, FIG. 3A is a cross-sectional view for a first sub-pixel SPX1 and a second sub-pixel SPX2, and FIG. 3B is a cross-sectional view for a third sub-pixel SPX3. All the components of the light emitting display apparatus according to all embodiments of the present disclosure are operatively coupled and configured.

With reference to FIG. 1 to FIG. 3B, a light emitting display apparatus 100 can include a substrate 110, a thin film transistor 120, a light emitting element 130, an overcoating layer 140, a bank layer 114, and an encapsulation part 150. The light emitting display apparatus 100 can be implemented as a top emission type light emitting display apparatus.

The substrate 110 includes a display area A/A and a non-display area N/A.

The display area A/A is an area where an image is displayed in the light emitting display apparatus 100. In the display area A/A, a plurality of display elements and a variety of driving elements for driving the display elements can be disposed. For example, the display element can be configured of the light emitting element 130 including a first electrode 131, a light emitting layer 132 and a second electrode 133. In addition, various driving elements for driving the display element, such as the thin film transistor, a capacitor or wirings, can be disposed in the display area A/A.

The display area A/A can include a plurality of sub-pixels SPX. The sub-pixel SPX is a minimum unit for configuring a screen, and each of the plurality of sub-pixels SPX can include the light emitting element 130 and a driving circuit. Each of the plurality of sub-pixels SPX can emit different wavelengths of light. For example, the plurality of sub-pixels SPX can include a first sub-pixel SPX1 which is a red sub-pixel as an example, a second sub-pixel SPX2 which is a green sub-pixel as an example, and a third sub-pixel SPX3 which is a blue sub-pixel as an example. However, embodiments are not limited thereto, and as a variation, the plurality of sub-pixels SPX can further include a white sub-pixel.

The driving circuit of the sub-pixels SPX is a circuit for controlling a driving of the light emitting element 130. For example, the driving circuit can be configured to include the thin film transistor 120 and a capacitor, but is not limited thereto.

The non-display area N/A is an area where no image is displayed, and various components for driving the plurality of sub-pixels SPX disposed in the display area A/A can be disposed. For example, a driver IC which supplies a signal for driving the plurality of sub-pixels SPX, a flexible film or the like can be disposed in the non-display area N/A.

The non-display area N/A can be an area surrounding the display area A/A as illustrated in FIG. 1, but is not limited thereto. For example, the non-display area N/A can be an area extending from the display area A/A.

With reference to FIGS. 3A and 3B, the substrate 110 can support and protect various components of the light emitting display apparatus 100. The substrate 110 can be formed of glass or a plastic material having flexibility. When the substrate 110 is formed of a plastic material, for example, it can be formed of polyimide (PI). However, embodiments of the present disclosure are not limited thereto.

A buffer layer 111 is disposed on the substrate 110. The buffer layer 111 can improve adhesion between layers formed on the buffer layer 111 and the substrate 110 and can block an alkali component or the like, flowing out from the substrate 110. The buffer layer 111 can be formed of a single layer of silicon nitride (SiNx) or silicon oxide (SiOx) or a multiple layer of silicon nitride (SiNx) or silicon oxide (SiOx), but is not limited thereto. The buffer layer 111 can be omitted based on a type and material of the substrate 110 and a structure and type of the thin film transistor 120.

The thin film transistor 120 is disposed on the substrate 110. The thin film transistor 120 can be used as a driving element of the light emitting display apparatus 100. The thin film transistor 120 includes a gate electrode 121, an active layer 122, a source electrode 123, and a drain electrode 124. In the light emitting display apparatus 100 according to an exemplary embodiment of the present disclosure, the thin film transistor 120 has a structure in which the active layer 122 is disposed on the gate electrode 121, and the source electrode 123 and the drain electrode 124 are disposed on the active layer 122. Therefore, the thin film transistor 120 has a bottom gate structure in which the gate electrode 121 is disposed in the lowermost portion, but embodiments are not limited thereto.

The gate electrode 121 of the thin film transistor 120 is disposed on the substrate 110. The gate electrode 121 can be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof, but, embodiments are not limited thereto.

A gate insulating layer 112 is disposed on the gate electrode 121. The gate insulating layer 112 is a layer for electrically insulating the gate electrode 121 and the active layer 122 from each other and can be formed of an insulating material. For example, the gate insulating layer 112 can be formed of a single layer of silicon nitride (SiNx) or silicon oxide (SiOx) which is an inorganic material or a multiple layer of silicon nitride (SiNx) or silicon oxide (SiOx), but embodiments are not limited thereto.

The active layer 122 is disposed on the gate insulating layer 112. The active layer 122 is disposed to overlap the gate electrode 121. For example, the active layer 122 can be formed of an oxide semiconductor or formed of amorphous silicon (a-Si), polycrystalline silicon (poly-Si), an organic semiconductor or the like.

An etch stopper 117 is disposed on the active layer 122. The etch stopper 117 prevents damage to a surface of the active layer 122 due to plasma when the source electrode 123 and the drain electrode 124 are patterned by an etching method. One portion of the etch stopper 117 can overlap the source electrode 123, and the other portion of the etch stopper 117 can overlap the drain electrode 124. However, the etch stopper 117 can be omitted.

The source electrode 123 and the drain electrode 124 are disposed on the active layer 122 and the etch stopper 117. The source electrode 123 and the drain electrode 124 are disposed in the same layer to be spaced apart from each other. The source electrode 123 and the drain electrode 124 can be electrically connected to the active layer 122 to be in contact with the active layer 122. The source electrode 123 and the drain electrode 124 can be formed of any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof, but, embodiments are not limited thereto.

The overcoating layer 140 is disposed on the thin film transistor 120. The overcoating layer 140 is an insulating layer for protecting the thin film transistor 120 and smoothing a step difference of layers disposed on the substrate 110. The overcoating layer 140 can be formed of one of acrylic-based resin, epoxy resin, phenol resin, polyamide-based resin, polyimide-based resin, unsaturated polyester-based resin, polyphenylene-based resin, polyphenylene sulfide-based resin, benzocyclobutene, and photoresist, but embodiments are not limited thereto.

The overcoating layer 140 includes a base portion 141 and a protrusion portion 142. The base portion 141 and the protrusion portion 142 can be integrally formed as shown in FIGS. 3A and 3B. For example, the base portion 141 and the protrusion portion 142 can be formed of the same material and formed simultaneously through the same process, for example, a mask process, but embodiments are not limited thereto.

The base portion 141 is disposed on the thin film transistor 120. An upper surface of the base portion 141 has a surface parallel to the substrate 110. Accordingly, the base portion 141 can planarize a step difference that can be caused by components disposed under the base portion 141. For example, the base portion 141 can planarize a step difference that can be caused by the thin film transistor 120 disposed under the overcoating layer 140.

The protrusion portion 142 is disposed on the base portion 141. The protrusion portion 142 is disposed in a non-light emitting area NEA. The protrusion portion 142 is integrally formed with the base portion 141 and is formed to protrude from the base portion 141. Thus, an upper surface of the protrusion portion 142 can be smaller than a lower surface thereof. However, embodiments are not limited thereto.

The protrusion portion 142 includes the upper surface and a side surface. The upper surface of the protrusion portion 142 can be a surface at the uppermost portion of the protrusion portion 142 and can be a surface substantially parallel to the base portion 141 or the substrate 110. The side surface of the protrusion portion 142 can be a surface connecting the upper surface of the protrusion portion 142 and the base portion 141.

FIGS. 3A and 3B illustrate that the overcoating layer 140 includes the base portion 141 having a planar upper surface and the protrusion portion 142 protruding from the base portion 141. However, as long as the overcoating layer 140 has a shape in which the base portion 141 and the protrusion portion 142 are embodied, a detailed configuration of the overcoating layer 140 is not limited to the base portion 141 and the protrusion portion 142, and can be variously implemented.

The light emitting element 130 is disposed on the overcoating layer 140. The light emitting element 130 includes the first electrode 131, the light emitting layer 132, and the second electrode 133.

The first electrode 131 is disposed on the overcoating layer 140 to cover the base portion 141 and a side portion of the protrusion portion 142. For example, the first electrode 131 is disposed on the upper surface of the base portion 141 on which the protrusion portion 142 is not disposed, the side portion of the protrusion portion 142, and a portion of the upper surface of the protrusion portion 142. And, the first electrode 131 is disposed along shapes of the base portion 141 and the protrusion portion 142. However, embodiments are not limited thereto. For example, the first electrode 131 can be disposed only on the upper surface of the base portion 141 on which the protrusion portion 142 is not formed, and the side portion of the protrusion portion 142.

The first electrode 131 includes a reflective layer 131A electrically connected to the thin film transistor 120 and a transparent conductive layer 131B disposed on the reflective layer 131A.

The reflective layer 131A of the first electrode 131 is disposed on the overcoating layer 140. Since the light emitting display apparatus 100 according to an exemplary embodiment of the present disclosure is a top emission type light emitting display apparatus, the reflective layer 131A can reflect light emitted from the light emitting element 130 upwardly. Light generated from the light emitting layer 132 of the light emitting element 130 may not be emitted only upwardly, but can also be emitted laterally. The light emitted laterally can be directed to the inside of the light emitting display apparatus 100 and can be trapped inside the light emitting display apparatus 100 by total reflection. The light trapped inside the light emitting display apparatus 100 can travel in an inward direction of the light emitting display apparatus 100 and disappear therein. Accordingly, the reflective layer 131A is disposed under the light emitting layer 132 and is disposed to cover the side portion of the protrusion portion 142, whereby a traveling direction of light traveling toward a side portion of the light emitting layer 132 can be changed to a front direction.

The reflective layer 131A can be formed of a metal material, and for example, can be formed of a metal material such as aluminum (Al), silver (Ag), copper (Cu), or magnesium-silver alloy (Mg: Ag), but embodiments are not limited thereto. The reflective layer 131A can be electrically connected to the drain electrode 124 through a contact hole in the overcoating layer 140. And, embodiments are not limited thereto. For example, the reflective layer 131A can be electrically connected to the source electrode 123 through the contact hole in the overcoating layer 140.

The transparent conductive layer 131B is disposed on the reflective layer 131A. The transparent conductive layer 131B is disposed on the reflective layer 131A and is electrically connected to the drain electrode 124 through the reflective layer 131A. The transparent conductive layer 131B can be formed of a conductive material having a high work function to supply holes to the light emitting layer 132. For example, the transparent conductive layer 131B can be formed of a transparent conductive oxide such as indium tin oxide (ITO), indium zinc oxide (IZO), indium tin zinc oxide (ITZO), zinc oxide (ZnO), and tin oxide (TO), but embodiments are not limited thereto. For example, when the transparent conductive layer 131B is formed of indium tin oxide (ITO), a refractive index of the transparent conductive layer 131B can be about 1.8.

FIGS. 3A and 3B illustrate that the first electrode 131 includes the reflective layer 131A and the transparent conductive layer 131B disposed on the reflective layer 131A. However, the first electrode 131 can further include an additional transparent conductive layer disposed between the reflective layer 131A and the overcoating layer 140. For example, the first electrode 131 can have a structure in which an additional transparent conductive layer, the reflective layer 131A and the transparent conductive layer 131B are sequentially stacked. In this case, an additional transparent conductive layer can be formed of the same material as the transparent conductive layer 131B and can enhance adhesion between the first electrode 131 and the overcoating layer 140. In addition, a thickness of an additional transparent conductive layer on the upper surface of the base portion 141, on which the protrusion portion is not disposed, can be identical to a thickness of the transparent conductive layer 131B, but embodiments are not limited thereto.

The bank layer 114 is disposed on the first electrode 131 and the overcoating layer 140. The bank layer 114 can cover a portion of the first electrode 131 of the light emitting element 130 and the overcoating layer 140 in the plurality of sub-pixels SPX, and can include a non-light emitting area NEA. For example, in the non-light emitting area NEA, the bank layer 114 can be disposed on the first electrode 131 to block generation of light in the non-light emitting area NEA. Since the bank layer 114 is not disposed in the light emitting area EA, the light emitting layer 132 can be directly positioned on the first electrode 131, whereby light can be generated from the light emitting layer 132.

The bank layer 114 can be formed of an organic material. For example, the bank layer 114 can be formed of an organic material such as polyimide, acrylic, or benzocyclobutene-based resin or the like, but embodiments are not limited thereto. For example, the bank layer 114 is formed using polyimide, a refractive index of the bank layer 114 can be about 1.6.

The light emitting layer 132 is disposed to be in contact with first electrode 131 in the plurality of sub-pixels SPX. For example, the light emitting layer 132 can be disposed in the light emitting area EA on the first electrode 131. For example, the light emitting layer 132 can be disposed to be surrounded by the bank layer 114.

The light emitting layer 132 is a layer for emitting light of a specific color and has a structure separated for each sub-pixel SPX. For example, the light emitting layer 132 disposed in the first sub-pixel SPX1 which is a red sub-pixel is a red light emitting layer, the light emitting layer 132 disposed in the second sub-pixel SPX2 which is a green sub-pixel is a green light emitting layer, and the light emitting layer 132 disposed in the third sub-pixel SPX3 which is a blue sub-pixel is a blue light emitting layer. The light emitting layer 132 disposed in the first sub-pixel SPX1, the light emitting layer 132 disposed in the second sub-pixel SPX2, and the light emitting layer 132 disposed in the third sub-pixel SPX3 can be separately disposed. Each light emitting layer 132 can be pattern-deposited in each light emitting area EA by using a mask opened in each sub-pixel SPX, for example, a fine metal mask (FMM). The light emitting layer 132 can further include various layers such as a hole transporting layer, a hole injection layer, a hole blocking layer, an electron injection layer, an electron transporting layer, an electron blocking layer, and the like. Various organic layers can be formed as a single layer in all of the sub-pixels SPX. In addition, the light emitting layer 132 can be an organic light emitting layer formed of an organic material, but is not limited thereto. For example, the light emitting layer 132 can be formed of a quantum dot light emitting layer or a micro-LED.

In the plurality of sub-pixels SPX, the second electrode 133 is disposed on the light emitting layer 132 and the bank layer 114. For example, the second electrode 133 is disposed to be in contact with light emitting layer 132 in the light emitting area EA and can be disposed along a shape of the light emitting layer 132. In addition, the second electrode 133 can be disposed to be in contact with bank layer 114 in the non-light emitting area NEA and can be disposed along a shape of the bank layer 114.

The second electrode 133 supplies electrons to the light emitting layer 132. The second electrode 133 can be formed of a metal material such as silver (Ag), copper (Cu) and a magnesium-silver alloy (Mg: Ag), or can be formed of a transparent conductive oxide or an alloy of ytterbium (Yb). However, embodiments are not limited thereto.

Since the light emitting display apparatus 100 according to an exemplary embodiment of the present disclosure is a top emission type light emitting display apparatus, it can be manufactured such that a micro-cavity is implemented. For example, in the light emitting display apparatus 100 according to an exemplary embodiment of the present disclosure, constructive interference with respect to light emitted from the light emitting layer 132 can be implemented by adjusting a distance between the reflective layer 131A and the second electrode 133, thereby enhancing light efficiency. Accordingly, in the light emitting display apparatus 100 according to an exemplary embodiment of the present disclosure, a micro-cavity can be implemented by differently configuring a thickness value of the light emitting layer 132 for each sub-pixel SPX.

The encapsulation part 150 is disposed on the second electrode 133. The encapsulation part 150 is disposed on the overcoating layer 140 and the light emitting element 130. The encapsulation part 150 can block oxygen and moisture penetrating into the inside of the light emitting display apparatus 100 from the outside thereof. For example, when the light emitting display apparatus 100 is exposed to moisture or oxygen, a pixel shrinkage phenomenon in which the light emitting area EA is reduced can occur, or a defect that a black spot occurs in the light emitting area EA can be caused. Accordingly, the encapsulation part 150 can block oxygen and moisture to protect the light emitting display apparatus 100.

The encapsulation part 150 includes a first encapsulation layer 151, a second encapsulation layer 152, and a third encapsulation layer 153.

The first encapsulation layer 151 is disposed on the second electrode 133 and inhibits the penetration of moisture or oxygen. The first encapsulation layer 151 can be formed of an inorganic material such as silicon nitride ($SiN_x$), silicon oxynitride ($SiN_xO_y$), aluminum oxide ($Al_yO_z$) or the like, but embodiments are not limited thereto.

The second encapsulation layer 152 is disposed on the first encapsulation layer 151 to planarize a surface thereof.

In addition, the second encapsulation layer 152 can cover foreign matter or particles that can occur in a manufacturing process. The second encapsulation layer 152 can be formed of an organic material, for example, silicon oxycarbon (SiOxCz), acrylic or epoxy-based resin or the like, but embodiments are not limited thereto.

The third encapsulation layer 153 is disposed on the second encapsulation layer 152, and similarly to the first encapsulation layer 151, it can prevent or inhibit the penetration of moisture or oxygen. The third encapsulation layer 153 can be formed of an inorganic material such as silicon nitride (SiNx), silicon oxynitride (SiNxOy), silicon oxide (SiOx), aluminum oxide (AlyOz) or the like, but embodiments are not limited thereto.

In related art light emitting display apparatuses, light trapped and lost inside the light emitting display apparatus among light emitted from a light emitting layer, has become a factor in lowering light efficiency. For example, in the light emitted from the light emitting layer, there occurs light that may not be extracted to the outside of the light emitting display apparatus due to a loss in total reflection or a loss in optical waveguide, so that light extraction efficiency of the light emitting display apparatus is degraded. For example, in related art light emitting display apparatuses, since a first electrode formed on an overcoating layer having a planar upper surface is used, light emitted at a low emission angle, of the light emitted from the light emitting layer, can be trapped in the light emitting display apparatuses by a loss in total reflection or a loss in optical waveguide.

Accordingly, the light emitting display apparatus 100 according to an exemplary embodiment of the present disclosure can improve light extraction efficiency of the light emitting element 130 by using the overcoating layer 140 having the protrusion portion 142. For example, in the light emitting display apparatus 100 according to an exemplary embodiment of the present disclosure, the overcoating layer 140 is configured to include the base portion 141 and the protrusion portion 142 protruding from the base portion 141, and the reflective layer 131A of the first electrode 131 of the light emitting element 130 is disposed to cover the base portion 141 on which the protrusion portion 142 is not disposed, and at least the side portion of the protrusion portion 142. Therefore, second light L2 emitted at a low emission angle, of the light emitted from the light emitting layer 132 of the light emitting display apparatus 100, can be extracted in a front direction by the reflective layer 131A disposed on the side portion of the protrusion portion 142. For example, as in related art light emitting display apparatuses, when a first electrode is disposed on an overcoating layer having a planar shape, laterally directed light, for example, light emitted at a low emission angle does not travel in the front direction and may not be extracted to the outside of the light emitting display apparatus due to a loss in total reflection or a loss in optical waveguide. However, in the light emitting display apparatus 100 according to an exemplary embodiment of the present disclosure, the second light L2 emitted at a low emission angle from the light emitting layer 132, together with first light L1 emitted from the light emitting layer 132 in the front direction, is reflected from the reflective layer 131A disposed on the side portion of the protrusion portion 142, and can be extracted in the front direction. Accordingly, in the light emitting display apparatus 100 according to an exemplary embodiment of the present disclosure, the reflective layer 131A disposed on a side portion of the overcoating layer 140 can be as a side mirror, whereby light that can be lost within the light emitting display apparatus 100 can be extracted in the front direction, thereby improving light extraction efficiency and enhancing power consumption.

The first light L1 emitted from the light emitting layer 132 in the front direction has an electroluminescence (EL) spectrum and implements a micro-cavity. On the other hand, the second light L2 which is emitted at a low emission angle from the light emitting layer 132, reflected from the reflective layer 131A disposed on the side portion of the protrusion portion 142, and then, extracted in the front direction can have photoluminescence (PL) characteristics. A PL spectrum is a spectrum of light emitted by receiving light energy, an EL spectrum is a spectrum of light emitted by receiving electrical energy, and a portion of the light energy can be dissipated in the form of energy such as heat. Thus, in the PL spectrum, there can exist light of energy relatively lower than that in the EL spectrum, for example, light of a long wavelength region. Thus, due to additional light contributed by the second light L2 having PL characteristics, light emitted outwardly of the light emitting display apparatus 100 can have a higher increase rate in a long wavelength range, than in a short wavelength range.

For example, in the first sub-pixel SPX1 which is a red sub-pixel, since red light emitted from the red sub-pixel has a long wavelength, the first light L1 and the second light L2 are extracted from the first sub-pixel SPX1 and thus, color gamut can be further implemented. Accordingly, as illustrated in FIG. 3A, in the first sub-pixel SPX1, a thickness of the transparent conductive layer 131B of the first electrode 131 can be the same in both the light emitting area EA and the non-light emitting area NEA. For example, a thickness of the transparent conductive layer 131B on the base portion 141 can be identical to a thickness of the transparent conductive layer 131B on the protrusion portion 142.

In addition, in the second sub-pixel SPX2 which is a green sub-pixel, a change in color coordinates can be caused since an increase rate of light extracted in a long wavelength range by the second light L2 is high. However, in general, since the efficiency of a material used as a light emitting layer for emitting green light is superior to those of light emitting layers for emitting colored light other than green light, the intensity in the entire wavelength range is reduced to remove the increased amount of light in the long wavelength range, thereby preventing a change in color coordinates. Accordingly, as illustrated in FIG. 3A, in the second sub-pixel SPX2, a thickness of the transparent conductive layer 131B of the first electrode 131 can be the same in both the light emitting area EA and the non-light emitting area NEA. For example, a thickness of the transparent conductive layer 131B on the base portion 141 can be identical to a thickness of the transparent conductive layer 131B on the protrusion portion 142.

Next, in the third sub-pixel SPX3 which is a blue sub-pixel, since an increase rate of light extracted in the long wavelength range by the second light L2 is high, a color coordinate change can occur. In addition, in general, the efficiency of a material used as a light emitting layer for emitting blue light is very lower than those of light emitting layers for emitting colored light other than blue light. Accordingly, in the third sub-pixel SPX3, in a case in which the intensity in the entire wavelength range is reduced to remove the increased amount of light in the long wavelength range in the same manner as the second sub-pixel SPX2, light efficiency improved by implementing the micro-cavity can be reduced again.

Accordingly, in the light emitting display apparatus 100 according to an exemplary embodiment of the present disclosure, the thickness of the transparent conductive layer 131B in the third sub-pixel SPX3 which is the blue sub-pixel among the plurality of sub-pixels SPX is adjusted, thereby preventing or minimizing a color coordinate change that can occur in the third sub-pixel SPX3 by the second light L2.

With reference to FIG. 3B, in the third sub-pixel SPX3 which is the blue sub-pixel, the transparent conductive layer 131B includes a first portion 131B1 which is a first transparent conductive layer, a second portion 131B2 which is a second transparent conductive layer, and a third portion 131B3 which is a third transparent conductive layer.

The first portion 131B1 of the transparent conductive layer 131B is a portion of the transparent conductive layer 131B, which is disposed on the base portion 141. The first portion 131B1 can be disposed to be in contact with the base portion 141 of the overcoating layer 140. For example, the first portion 131B1 can be disposed in the light emitting area EA on the base portion 141 of the overcoating layer 140.

A thickness t1 of the first portion 131B1 can be set to an optimal thickness to implement a micro-cavity. For example, the thickness t1 of the first portion 131B1 in the third sub-pixel SPX3 can be 7 nm, but embodiments are not limited thereto. In addition, as described above, when the first electrode 131 further includes another transparent conductive layer disposed between the reflective layer 131A and the overcoating layer 140, the thickness t1 of the first portion 131B1 and a thickness of another transparent conductive layer disposed under the first portion 131B1 can be the same as each other.

The second portion 131B2 of the transparent conductive layer 131B is disposed on the protrusion portion 142. For example, the second portion 131B2 can be disposed in the non-light emitting area NEA on the overcoating layer 140 and can be disposed in the non-light emitting area NEA on the protrusion portion 142. The second portion 131B2 is disposed to be inclined with respect to the first portion 131B1 and can extend from the first portion 131B1. The second portion 131B2 is disposed in contact with the bank layer 114 disposed on an upper portion thereof and may not contribute to generating light.

A thickness t2 of the second portion 131B2 can be greater than the thickness t1 of the first portion 131B1. For example, a vertical distance between a lower surface of the second portion 131B2 contacting the reflective layer 131A and an upper surface of the second portion 131B2 contacting the bank layer 114 can be greater than the thickness t1 of the first portion 131B1. For example, the thickness t2 of the second portion 131B2 can be 45 nm to 75 nm. In addition, as described above, when the first electrode 131 further includes another transparent conductive layer disposed between the reflective layer 131A and the overcoating layer 140, the thickness t2 of the second portion 131B2 can be greater than a thickness of another transparent conductive layer disposed under the second portion 131B2.

The third portion 131B3 of the transparent conductive layer 131B is disposed on the protrusion portion 142. For example, the third portion 131B3 can be disposed in the non-light emitting area NEA on the overcoating layer 140. As the third portion 131B3 is disposed to be in contact with the upper surface of the protrusion portion 142, the third portion 131B3 can be disposed to be parallel to the first portion 131B1. The third portion 131B3 is disposed to be inclined with respect to the second portion 131B2 and can extend from the second portion 131B2. The third portion 131B3 is disposed in contact with the bank layer 114 disposed on an upper portion thereof, and may not contribute to generating light.

A thickness t3 of the third portion 131B3 can be the same as any one of the thickness t1 of the first portion 131B1 and the thickness t2 of the second portion 131B2. For example, when the third portion 131B3 and the first portion 131B1 are simultaneously formed for convenience of manufacturing, the thickness t3 of the third portion 131B3 can be the same as the thickness t1 of the first portion 131B1. When the third portion 131B3 and the second portion 131B2 are simultaneously formed, the thickness t3 of the third portion 131B3 can be the same as the thickness t2 of the second portion 131B2. However, embodiments of the present disclosure are not limited thereto, and the thickness t3 of the third portion 131B3 can be different from both the thickness t1 of the first portion 131B1 and the thickness t2 of the second portion 131B2.

In the light emitting display apparatus 100 according to an exemplary embodiment of the present disclosure, the thickness of the transparent conductive layer 131B of the first electrode 131 disposed in the third sub-pixel SPX3 which is a blue sub-pixel, can be adjusted to thereby reduce reflectance of light having a wavelength different from that of blue light. In a stacked structure composed of layers having different refractive indices, at an interface where a difference in refractive index occurs, constructive interference and destructive interference with respect to light passing through the interface can occur. For example, when layers having different refractive indices are disposed in a traveling path of light, reflectance in a specific wavelength range can be reduced by constructive interference and destructive interference due to Fresnel reflection. Accordingly, the bank layer 114 and the second portion 131B2 of the transparent conductive layer 131B of the first electrode 131 disposed on the side portion of the protrusion portion 142 are configured to have different refractive indices, and a stacked structure of the second portion 131B2 and the bank layer 114 can reduce extraction of light in a specific wavelength range. For example, the second light L2 emitted at a low emission angle from the light emitting layer 132 and traveling to the side portion of the protrusion portion 142 passes through the second portion 131B2 and the bank layer 114, is reflected from the reflective layer 131A disposed on the side portion of the protrusion portion 142, and can be extracted in the front direction. In this case, a reflection and interference phenomenon occurs at an interface between the second portion 131B2 and the bank layer 114 having different refractive indices and at an interface between the bank layer 114 and a layer disposed on the bank layer 114 with respect to the light traveling to the side portion of the protrusion portion 142. And, reflectance in a specific wavelength range of light extracted upwardly of the light emitting display apparatus 100 can be lowered.

Accordingly, in the light emitting display apparatus 100 according to an exemplary embodiment of the present disclosure, the transparent conductive layer 131B of the first electrode 131 is configured to include the first portion 131B1, the second portion 131B2, and the third portion 131B3. And, the thickness t2 of the second portion 131B2 disposed on the side portion of the protrusion portion 142 among the non-light emitting area NEA is set to be different from the thickness t1 of the first portion 131B1. Accordingly, reflectance of light at a specific wavelength can be adjusted. For example, in the light emitting display apparatus 100 according to an exemplary embodiment of the present disclosure, the reflectance of light at a wavelength different from that of blue light can be reduced.

In addition, in the light emitting display apparatus 100 according to an exemplary embodiment of the present disclosure, a wavelength of light extracted from the light emitting display apparatus 100 can be adjusted without an additional component. For example, by adjusting only the thickness of the transparent conductive layer 131B of the first electrode 131, a wavelength of light reflected and extracted from the side portion of the protrusion portion 142 in the non-light emitting area NEA can be adjusted. Therefore, in the light emitting display apparatus 100 according to an exemplary embodiment of the present disclosure, a process necessary to form an additional component for adjusting a wavelength of light can be minimized, and a manufacturing time and cost can also be minimized.

In addition, in the light emitting display apparatus 100 according to an exemplary embodiment of the present disclosure, with the transparent conductive layer 131B disposed in the non-light emitting area NEA, a change in color coordinates caused by the second light L2 emitted through the non-light emitting area NEA can be prevented or inhibited, while maintaining high light efficiency implemented by the micro-cavity in the light emitting area EA. In the light emitting display apparatus 100 according to an exemplary embodiment of the present disclosure, the first portion 131B1 of the transparent conductive layer 131B disposed in the light emitting area EA has a thickness to implement a micro-cavity, and the second portion 131B2 of the transparent conductive layer 131B disposed in the non-light emitting area NEA has a thickness capable of minimizing generation of light in a long wavelength region. Accordingly, while maintaining high light efficiency of the first light L1 emitted from the light emitting area EA, a change in color coordinates of the second light L2 which is emitted at a low emission angle from the light emitting layer 132, reflected from the reflective layer 131A disposed on the side portion of the protrusion portion 142, and then, extracted in the front direction through the non-light emitting area NEA can be minimized, and color gamut can be improved. Meanwhile, a detailed thickness of the second portion 131B2 will be described in detail with reference to FIG. 7A.

Figure 4:
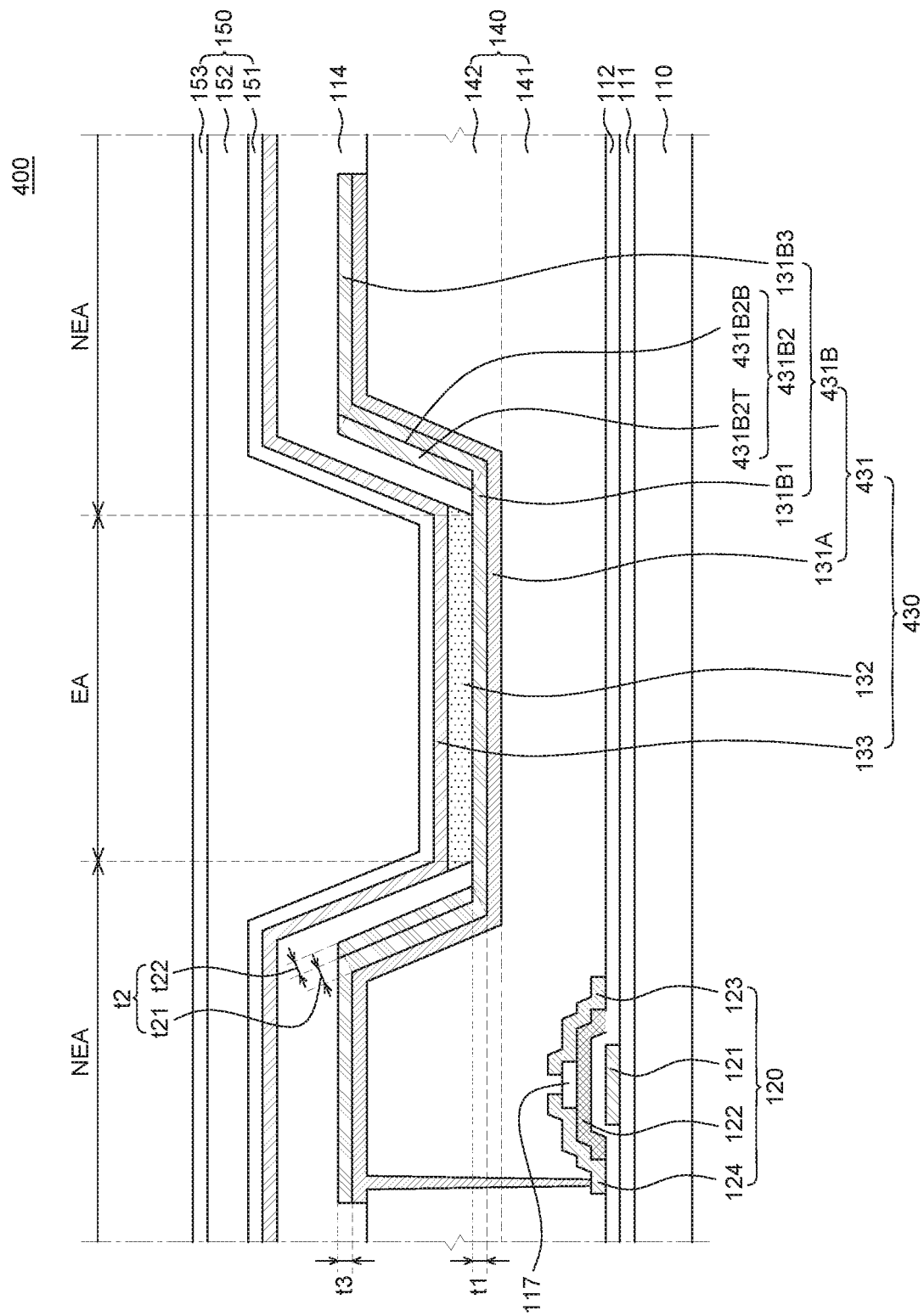
FIG. 4 is a cross-sectional view of a light emitting display apparatus according to another exemplary embodiment of the present disclosure.

FIG. 4 is a cross-sectional view of a light emitting display apparatus according to another exemplary embodiment of the present disclosure. A light emitting display apparatus 400 of FIG. 4 is different from the light emitting display apparatus 100 of FIGS. 1 to 3B in terms of a first electrode 431, but other configurations thereof are substantially the same as those of the light emitting display apparatus 100 of FIGS. 1 to 3B. Thus, a redundant description will be omitted or will be brief.

The first electrode 431 of a light emitting element 430 includes the reflective layer 131A and a transparent conductive layer 431B disposed on the reflective layer 131A.

The reflective layer 131A of the first electrode 431 is disposed on the overcoating layer 140. The reflective layer 131A is disposed under the light emitting layer 132 and is disposed to cover the side portion of the protrusion portion 142, thereby changing a traveling direction of light traveling laterally of the light emitting layer 132 to the front direction.

The transparent conductive layer 431B is disposed on the reflective layer 131A, and includes the first portion 131B1, a second portion 431B2, and the third portion 131B3.

The first portion 131B1 of the transparent conductive layer 431B is a portion of the transparent conductive layer 431B, which is disposed on the base portion 141. The first portion 131B1 can be disposed in the light emitting area EA on the base portion 141 of the overcoating layer 140. The thickness t1 of the first portion 131B1 can be adjusted to a thickness for implementing a micro-cavity.

The second portion 431B2 of the transparent conductive layer 431B is disposed on the protrusion portion 142. The second portion 431B2 can be disposed to be inclined with respect to the first portion 131B1. The second portion 431B2 is disposed to be in contact with the bank layer 114 disposed on an upper portion thereof, and may not contribute to generating light.

The second portion 431B2 is configured to include a plurality of layers. For example, the second portion 431B2 can include an upper layer 431B2T and a lower layer 431B2B. In FIG. 4, the second portion 431B2 is illustrated as being composed of two layers, but embodiments are not limited thereto. For example, the second portion 431B2 can further include the upper layer 431B2T, the lower layer 431B2B, and an additional layer between the upper layer 431B2T and the lower layer 431B2B.

The lower layer 431B2B of the second portion 431B2 is disposed on the protrusion portion 142. The lower layer 431B2B can extend from the first portion 131B1. For example, the lower layer 431B2B can be formed of the same material as the first portion 131B1 and can be integrally implemented with the first portion 131B1. In addition, a thickness t21 of the lower layer 431B2B can be identical to the thickness t1 of the first portion 131B1.

The upper layer 431B2T of the second portion 431B2 is disposed on the lower layer 431B2B thereof. The upper layer 431B2T can be disposed to be in contact with the lower layer 431B2B. The upper layer 431B2T can be formed of the same material as the lower layer 431B2B, and for example, can be formed of a material having the same refractive index.

The third portion 131B3 of the transparent conductive layer 431B is disposed on the protrusion portion 142.

The thickness t3 of the third portion 131B3 can be the same as the thickness t1 of the first portion 131B1 and the thickness t21 of the lower layer 431B2B. For example, when simultaneously forming the first portion 131B1, the lower layer 431B2B, and the third portion 131B3, the thickness t3 of the third portion 131B3 can be the same as the thickness t1 of the first portion 131B1 and the thickness t21 of the lower layer 431B2B. Thus, the transparent conductive layer 431B can include a first layer including the first portion 131B1, the lower layer 431B2B, and the third portion 131B3, and a second layer which is the upper layer 431B2T disposed on a portion of the first layer. However, embodiments of the present disclosure are not limited thereto, and the thickness t3 of the third portion 131B3 can be the same as the thickness t2 of the second portion 431B2, or be different from both the thickness t1 of the first portion 131B1 and the thickness t2 of the second portion 431B2.

In the light emitting display apparatus 400 according to another exemplary embodiment of the present disclosure, the transparent conductive layer 431B of the first electrode 431 is configured to include the first portion 131B1, the second portion 431B2, and the third portion 131B3. And, the thickness t2 of the second portion 431B2 disposed on the side portion of the protrusion portion 142 in the non-light emitting area NEA is adjusted to be different from the thickness t1 of the first portion 131B1. Accordingly, reflectance of light at a specific wavelength can be adjusted.

In addition, in the light emitting display apparatus 400 according to another exemplary embodiment of the present disclosure, only the thickness t1 of the transparent conductive layer 431B of the first electrode 431 is adjusted, thereby controlling a wavelength of light reflected and extracted from the side portion of the protrusion portion 142 in the non-light emitting area NEA. Therefore, in the light emitting display apparatus 400 according to another exemplary embodiment of the present disclosure, a process necessary to additionally form a component for adjusting a wavelength of light can be minimized, and a manufacturing time and cost can also be minimized.

In addition, in the light emitting display apparatus 400 according to another exemplary embodiment of the present disclosure, the first portion 131B1 of the transparent conductive layer 431B disposed in the light emitting area EA has a thickness for implementing a micro-cavity, and the second portion 431B2 of the transparent conductive layer 431B disposed in the non-light emitting area NEA has a thickness capable of minimizing generation of light in a long wavelength region. Accordingly, while maintaining high light efficiency of the first light L1 emitted from the light emitting area EA, a change in color coordinates of the second light L2 which is emitted at a low emission angle from the light emitting layer 132, reflected from the reflective layer 131A disposed on the side portion of the protrusion portion 142, and then, extracted in the front direction through the non-light emitting area NEA can be minimized, and color gamut or color reproduction rate can be improved.

In addition, in the light emitting display apparatus 400 according to another exemplary embodiment of the present disclosure, the second portion 431B2 of the transparent conductive layer 431B is configured to include a plurality of layers, thereby simplifying a manufacturing process of the transparent conductive layer 431B. For example, in the light emitting display apparatus 400, the transparent conductive layer 431B can include a first layer including the first portion 131B1, the lower layer 431B2B, and the third portion 131B3 and a second layer which is the upper layer 431B2T disposed on a portion of the first layer. Thus, the number of processes for manufacturing the transparent conductive layer 431B, such as a mask process, a lamination process and the like can be reduced, as compared to a case where the first portion 131B1, the second portion 431B2, and the third portion 131B3 are respectively formed in different processes. Accordingly, in the light emitting display apparatus 400 according to another exemplary embodiment of the present disclosure, a manufacturing process of the transparent conductive layer 431B can be simplified by configuring the second portion 431B2 of the transparent conductive layer 431B as a plurality of layers. In addition, a manufacturing cost of the light emitting display apparatus 400 and time required to manufacture the light emitting display apparatus 400 can be shortened.

Figure 5:
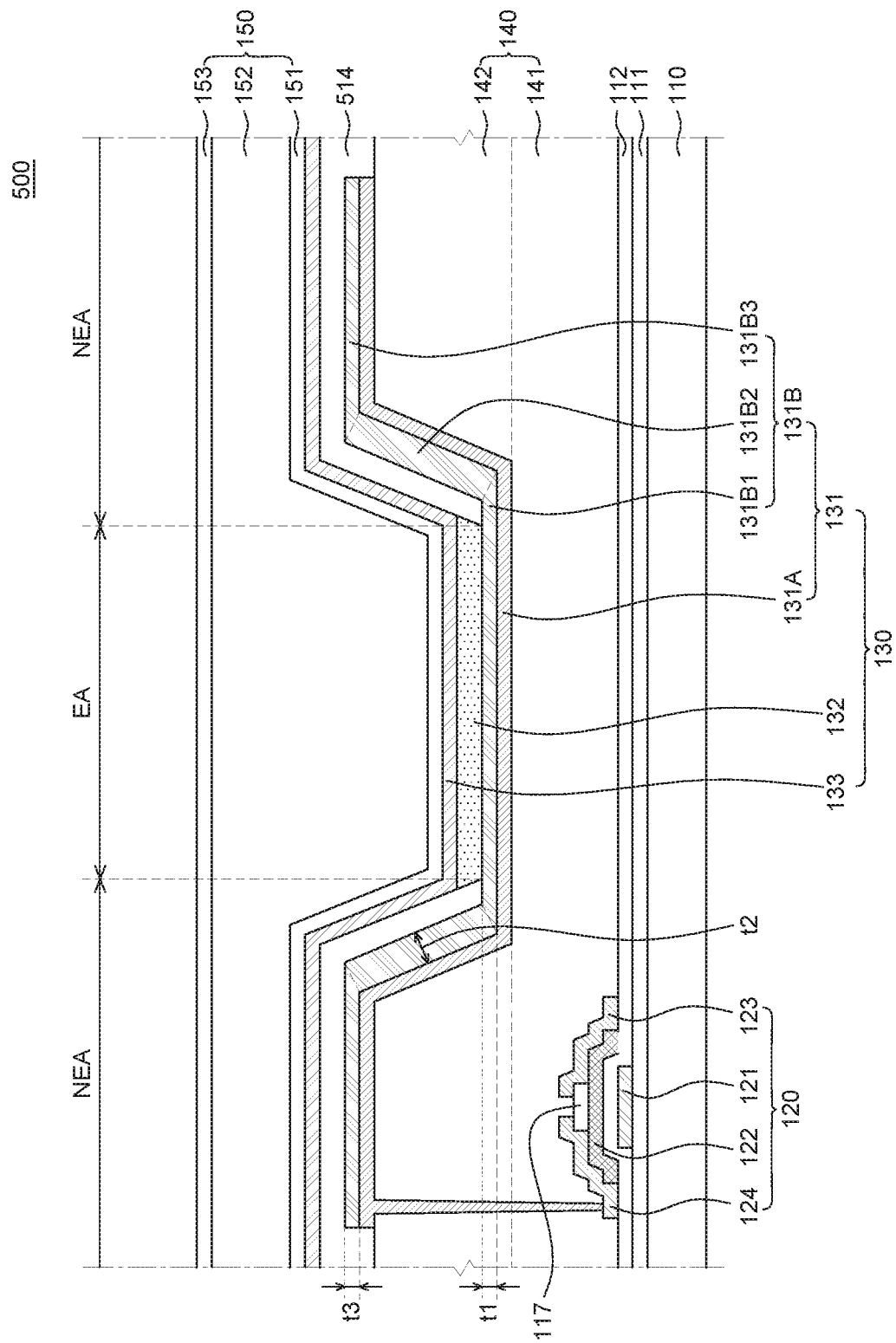
FIG. 5 is a cross-sectional view of a light emitting display apparatus according to another exemplary embodiment of the present disclosure.

FIG. 5 is a cross-sectional view of a light emitting display apparatus according to another exemplary embodiment of the present disclosure. A light emitting display apparatus 500 of FIG. 5 is different from the light emitting display apparatus 100 of FIGS. 1 to 3B in terms of a bank layer 514, but other configurations thereof are substantially the same as those of the light emitting display apparatus 100 of FIGS. 1 to 3B. Thus, a redundant description will be omitted or will be brief.

With reference to FIG. 5, a bank layer 514 is disposed on the first electrode 131. The bank layer 514 can be formed of an inorganic material. For example, the bank layer 514 can be formed of an inorganic material such as silicon nitride (SiNx) or silicon oxide (SiOx), but is not limited thereto. For example, when the bank layer 514 is formed of silicon nitride (SiNx), a refractive index of the bank layer 514 can be about 1.85.

As the bank layer 514 is formed of an inorganic material, a thickness of the bank layer 514 can be reduced compared to a case where the bank layer is formed of an organic material.

In the light emitting display apparatus 500 according to another exemplary embodiment of the present disclosure, the transparent conductive layer 131B of the first electrode 131 is configured to include the first portion 131B1, the second portion 131B2, and the third portion 131B3. And, the thickness t2 of the second portion 131B2 disposed on the side portion of the protrusion portion 142 in the non-light emitting area NEA is adjusted to be different from the thickness t1 of the first portion 131B1. Accordingly, reflectance of light at a specific wavelength can be adjusted.

In addition, in the light emitting display apparatus 500 according to another exemplary embodiment of the present disclosure, only the thickness of the transparent conductive layer 131B of the first electrode 131 is adjusted to thereby control a wavelength of light reflected and extracted from the side portion of the protrusion portion 142 in the non-light emitting area NEA. Therefore, in the light emitting display apparatus 500 according to another exemplary embodiment of the present disclosure, a process necessary to additionally form a component for adjusting a wavelength of light can be minimized, and a manufacturing time and cost can also be minimized.

Further, in the light emitting display apparatus 500 according to another exemplary embodiment of the present disclosure, the first portion 131B1 of the transparent conductive layer 131B disposed in the light emitting area EA has a thickness for implementing a micro-cavity, and the second portion 131B2 of the transparent conductive layer 131B disposed in the non-light emitting area NEA has a thickness capable of minimizing generation of light in a long wavelength region. Accordingly, while maintaining high light efficiency of the first light L1 emitted from the light emitting area EA, a change in color coordinates of the second light L2 which is emitted at a low emission angle from the light emitting layer 132, reflected from the reflective layer 131A disposed on the side portion of the protrusion portion 142, and then, extracted in the front direction through the non-light emitting area NEA can be minimized, and color gamut can be improved.

In the light emitting display apparatus 500 according to another exemplary embodiment of the present disclosure, the bank layer 514 having a refractive index different from a refractive index of the first electrode 131 is disposed on the first electrode 131, thereby controlling light extraction in each sub-pixel SPX. For example, when a reflective index of a material for configuring the bank layer 514 disposed on the transparent conductive layer 131B is higher than the refractive index of the transparent conductive layer 131B, light traveling laterally among light generated from the light emitting layer 132 passes through the bank layer 514 and the second portion 131B2, and constructive interference and destructive interference can occur according to a difference in the thickness between the bank layer 514 and the second portion 131B2. Accordingly, in the light emitting display apparatus 500 according to another exemplary embodiment of the present disclosure, by adjusting the thicknesses of the bank layer 514 and the second portion 131B2, a wavelength range in which constructive interference and destructive interference occur by reflection at an interface between the reflective layer 131A of the first electrode 131 and the second portion 131B2 and at an interface between the second portion 131B2 and the bank layer 514 can be set. For example, transmittance of light at a wavelength different from transmittance of blue light can be lowered, and light extraction in a long wavelength region can be restricted. The thicknesses of the second portion 131B2 and the bank layer 514 will be described in detail with reference to FIGS. 7B and 7C.

Figure 6:
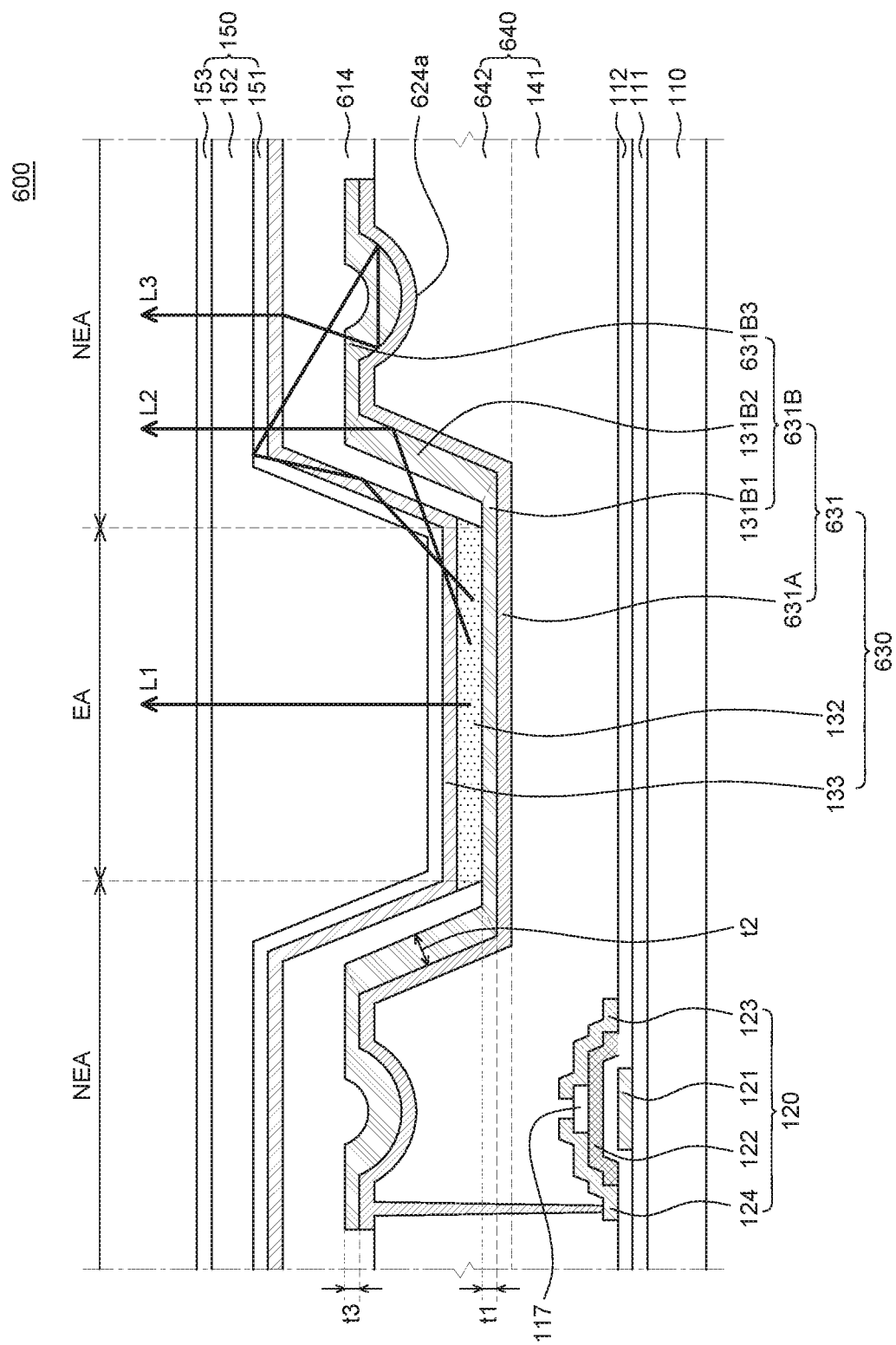
FIG. 6 is a cross-sectional view of a light emitting display apparatus according to another exemplary embodiment of the present disclosure.

FIG. 6 is a cross-sectional view of a light emitting display apparatus according to another exemplary embodiment of the present disclosure. A light emitting display apparatus 600 of FIG. 6 is different from the light emitting display apparatus 100 of FIGS. 1 to 3B in terms of an overcoating layer 640, a first electrode 631, and a bank layer 614, but other configurations thereof are substantially the same as those of the light emitting display apparatus 100 of FIGS. 1 to 3B. Thus, a redundant description will be omitted or will be brief.

A protrusion portion 642 of the overcoating layer 640 includes at least one curved portion or uneven portion 624a. The curved portion 624a can be disposed on a portion of an upper surface of the protrusion portion 642. Since the curved portion 624a can improve extraction efficiency and front efficiency of the light emitted from the light emitting layer 132, it can be a light extraction pattern. With reference to FIG. 6, the curved portion 624a is disposed to have a concave groove shape, and can have an elliptical shape in a cross-section. However, embodiments are not limited thereto.

FIG. 6 illustrates that one curved portion 624a is disposed on the left side of the display area A/A, and the other curved portion 624a is disposed on the right side of the display region A/A. However, the number of lines of the curved portions 624a and the number of dots of the curved portions 624a are not limited thereto, and can be variously changed.

The curved portion 624a can easily change a traveling direction of light guided to the outside of a side mirror structure. In addition, the curved portion 624a can easily change a traveling direction of light incident into the curved portion 624a.

The first electrode 631 of a light emitting element 630 is disposed on the overcoating layer 640 and can be disposed along shapes of the base portion 141 and the protrusion portion 642.

The first electrode 631 includes a reflective layer 631A and a transparent conductive layer 631B disposed on the reflective layer 631A.

The reflective layer 631A is disposed on the overcoating layer 640. The reflective layer 631A can be disposed along the shape of the curved portion 624a disposed on the protrusion portion 642 and have a curved upper surface on the upper surface of the protrusion portion 642. Accordingly, the reflective layer 631A has a planar upper surface on the upper surface of the base portion 141 and has a curved upper surface on the upper surface of the protrusion portion 642. The reflective layer 631A can have a planar surface on the upper surface of the protrusion portion 642 on which the curved portion 624a is not disposed, and have an inclined upper surface on the side portion of the protrusion portion 642.

The transparent conductive layer 631B is disposed on the reflective layer 631A along the shape of the reflective layer 631A.

With reference to FIG. 6, the transparent conductive layer 631B includes the first portion 131B1, the second portion 131B2, and a third portion 631B3.

The first portion 131B1 of the transparent conductive layer 631B is a portion of the transparent conductive layer 631B, which is disposed on the base portion 141. The first portion 131B1 can be disposed in the light emitting area EA on the base portion 141 of the overcoating layer 640. The thickness t1 of the first portion 131B1 can be set to an optimal thickness for implementing a micro-cavity.

The second portion 131B2 of the transparent conductive layer 631B is disposed on the protrusion portion 642. The second portion 131B2 is disposed to be inclined with respect to the first portion 131B1 and can extend from the first portion 131B1. The second portion 131B2 is disposed in contact with the bank layer 614 disposed on an upper portion thereof, and may not contribute to generating light. The thickness t2 of the second portion 131B2 can be greater than the thickness t1 of the first portion 131B1.

The third portion 631B3 of the transparent conductive layer 631B is disposed on the protrusion portion 642. For example, the third portion 631B3 can be disposed in the non-light emitting area NEA on the overcoating layer 640, and can be disposed in the non-light emitting area NEA on the protrusion portion 642.

The third portion 631B3 is disposed on the protrusion portion 642 and is disposed along the shape of the curved portion 624a. Accordingly, the third portion 631B3 can have a planer surface on the protrusion portion 642 and a curved surface on the curved portion 624a.

A thickness t3 of the third portion 631B3 can be the same as the thickness t2 of the second portion 131B2. However, embodiments are not limited thereto, and the thickness t3 of the third portion 631B3 disposed on the curved portion 624a can be the same as the thickness t2 of the second portion 131B2, and the thickness t3 of the third portion 631B3 disposed on the protrusion portion 642 on which the curved portion 624a is not disposed can be the same as the thickness t1 of the first portion 131B1.

The bank layer 614 is disposed on a portion of the first electrode 631 and the overcoating layer 640. The bank layer 614 can be formed of an organic material. As the bank layer 614 is formed of an organic material, the bank layer 614 can be disposed to fill a curved upper surface of the first electrode 631. Accordingly, the bank layer 614 is disposed on the protrusion portion 642 and can planarize an upper portion of the protrusion portion 642. The bank layer 614 can have a shape more planar than the upper surface of the protrusion portion 642.

In the light emitting display apparatus 600 according to another exemplary embodiment of the present disclosure, the transparent conductive layer 631B of the first electrode 631 is configured to include the first portion 131B1, the second portion 131B2, and the third portion 631B3. And, the thickness t2 of the second portion 131B2 disposed on the side portion of the protrusion portion 642 in the non-light emitting area NEA is adjusted to be different from the thickness t1 of the first portion 131B1. Accordingly, reflectance of light at a specific wavelength can be adjusted.

In addition, in the light emitting display apparatus 600 according to another exemplary embodiment of the present disclosure, only the thickness of the transparent conductive layer 631B of the first electrode 631 can be adjusted, thereby controlling a wavelength of light reflected and extracted from the side portion of the protrusion portion 642 in the non-light emitting area NEA. Therefore, in the light emitting display apparatus 600 according to another exemplary embodiment of the present disclosure, a process necessary to additionally form a component for adjusting a wavelength of light can be minimized, and a manufacturing time and cost can also be minimized.

In addition, in the light emitting display apparatus 600 according to another exemplary embodiment of the present disclosure, the first portion 131B1 of the transparent conductive layer 631B disposed in the light emitting area EA has a thickness for implementing a micro-cavity, and the second portion 131B2 of the transparent conductive layer 631B disposed in the non-light emitting area NEA has a thickness capable of minimizing generation of light in a long wavelength region. Accordingly, while maintaining high light efficiency of the first light L1 emitted from the light emitting area EA, a change in color coordinates of the second light L2 which is emitted at a low emission angle from the light emitting layer 132, reflected from the reflective layer 631A disposed on the side portion of the protrusion portion 642, and then, extracted in the front direction through the non-light emitting area NEA can be minimized, and color gamut can be improved.

In addition, in the light emitting display apparatus 600 according to another exemplary embodiment of the present disclosure, the curved portion 624a is disposed on the upper surface of the protrusion portion 642 of the overcoating layer 640, so that a path of light to be trapped between the bank layer 614 and the second encapsulation layer 152 by total reflection can be adjusted, thereby increasing light extraction efficiency of the light emitting display apparatus 600. For example, some of the light emitted from the light emitting layer 132 can be totally reflected and trapped inside the light emitting display apparatus 600. At this time, a traveling direction of third light L3 traveling in a direction of the curved portion 624a of the protrusion portion 642 among the light totally reflected inside the light emitting display apparatus 600 can be changed such that the third light L3 is extracted to the outside of the light emitting display apparatus 600 by the reflective layer 631A of the first electrode 631. For example, a material for configuring the bank layer 614 can have a refractive index of about 1.6, an organic material for configuring the light emitting layer 132 can have a refractive index of about 1.8, an inorganic material for configuring the first encapsulation layer 151 can have a refractive index of about 1.8, and an organic material for configuring the second encapsulation layer 152 can have a refractive index of about 1.5 to about 1.6. Accordingly, due to a difference in refractive index between the first encapsulation layer 151 and the second encapsulation layer 152, the light emitted from the light emitting layer 132 is totally reflected at an interface between the first encapsulation layer 151 and the second encapsulation layer 152 and at an interface between the light emitting layer 132 and the bank layer 614. Therefore, the third light L3 of the totally reflected light can be reflected at least once inside the curved surface of the reflective layer 631A of the first electrode 631 and extracted in the front direction.

Accordingly, in the light emitting display apparatus 600 according to another exemplary embodiment of the present disclosure, the reflective layer 631A of the first electrode 631 is disposed along the curved portion 624a of the protrusion portion 642 to thereby change a traveling direction of light that can be trapped between the bank layer 614 and the second encapsulation layers 152, so that light extraction efficiency of the light emitting display apparatus 600 and front efficiency thereof which is the extraction efficiency of light extracted in the front direction, can increase.

In addition, in the light emitting display apparatus 600 according to another exemplary embodiment of the present disclosure, the curved portion 624a is disposed on the upper surface of the protrusion portion 642 of the overcoating layer 640. And, the thickness t2 of the second portion 131B2 of the transparent conductive layer 631B disposed on the side surface of the protrusion portion 642 and the thickness t3 of the third portion 631B3 of the transparent conductive layer 631B disposed on the curved portion 624a are adjusted, whereby reflectance of light at a specific wavelength can be adjusted. For example, the third light L3 can pass through the second portion 131B2, the third portion 631B3, the bank layer 614, the first encapsulation layer 151, and the second encapsulation layer 152 that are disposed in the non-light emitting area NEA. And, the third light L3 passes through an interface having a difference in refractive index and thus, a reflection and interference phenomenon can occur. Accordingly, in the light emitting display apparatus 600 according to another exemplary embodiment of the present disclosure, the transparent conductive layer 631B of the first electrode 631 is configured to include the first portion 131B1, the second portion 131B2, and the third portion 631B3. And, the thicknesses of the second portion 131B2 and the third portion 631B3 are different from the thickness t1 of the first portion 131B1. Accordingly, a change in color coordinates of the third light L3 which is reflected from the curved surface of the reflective layer 631A of the first electrode 631 and extracted in the front direction can be minimized, and color gamut can be improved.

Figure 7A:
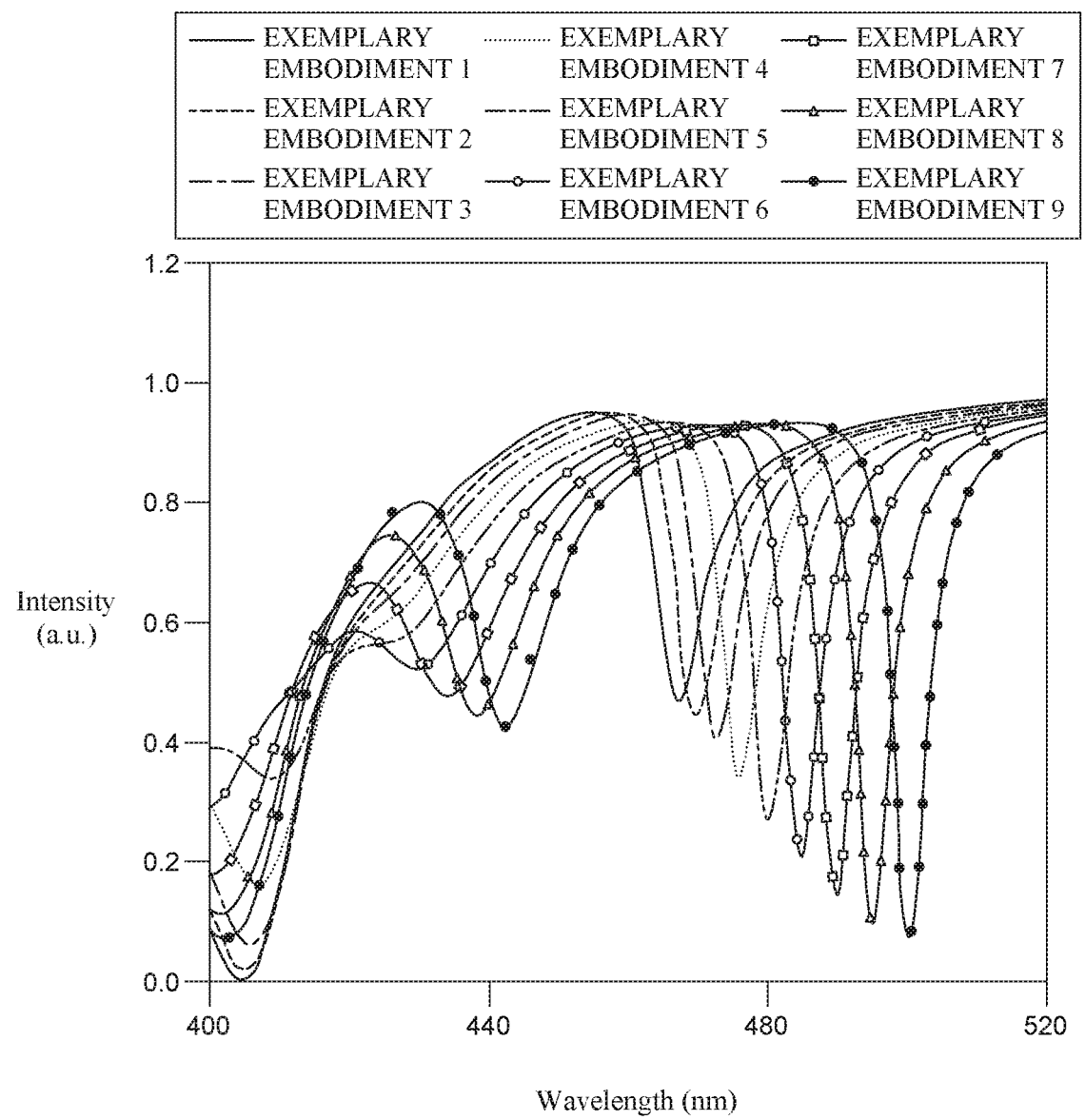
FIG. 7A to FIG. 7C are graphs illustrating light extraction spectra of the light emitting display apparatuses according to various exemplary embodiments of the present disclosure.
Figure 7B:
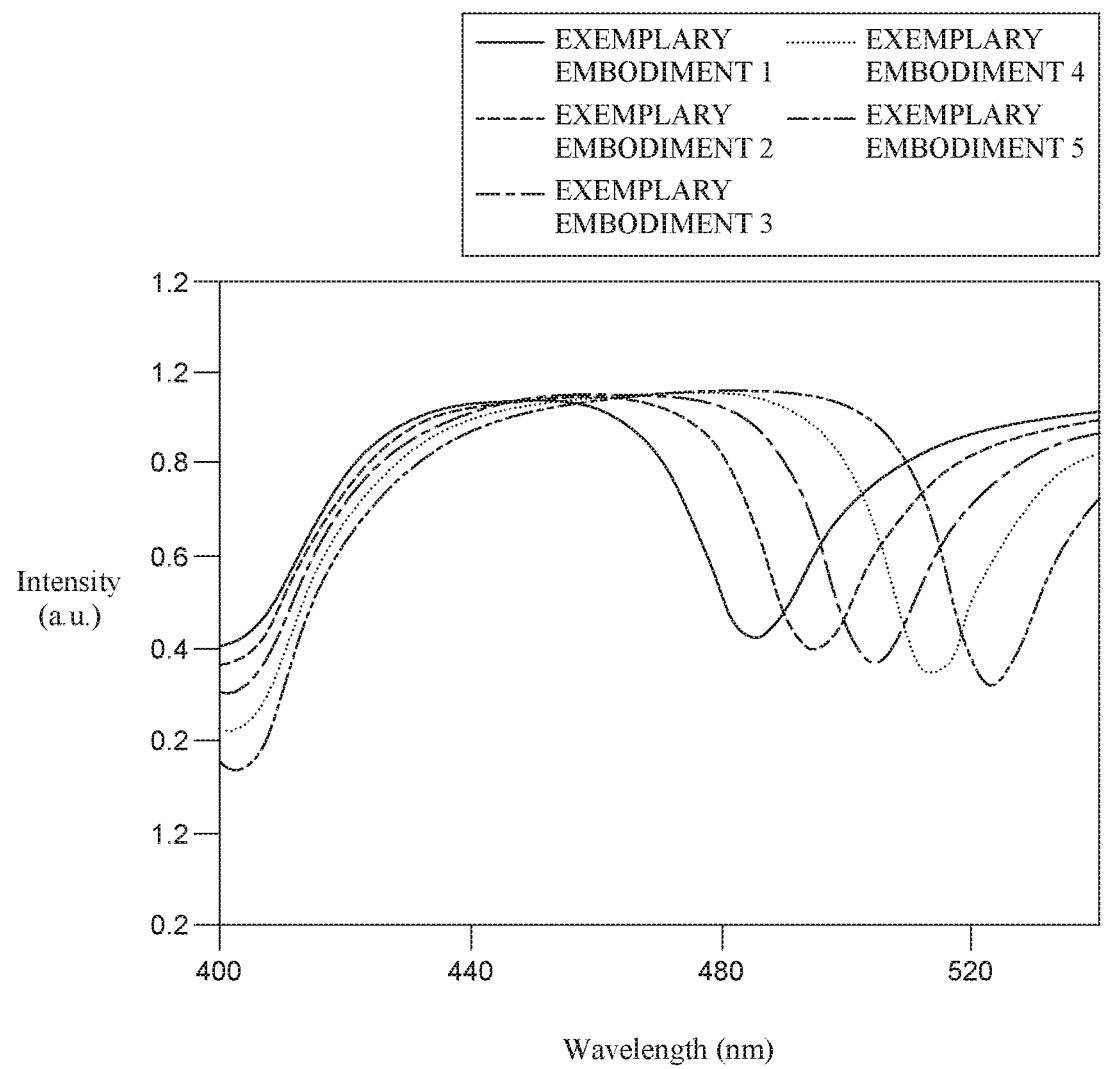
Figure 7C:
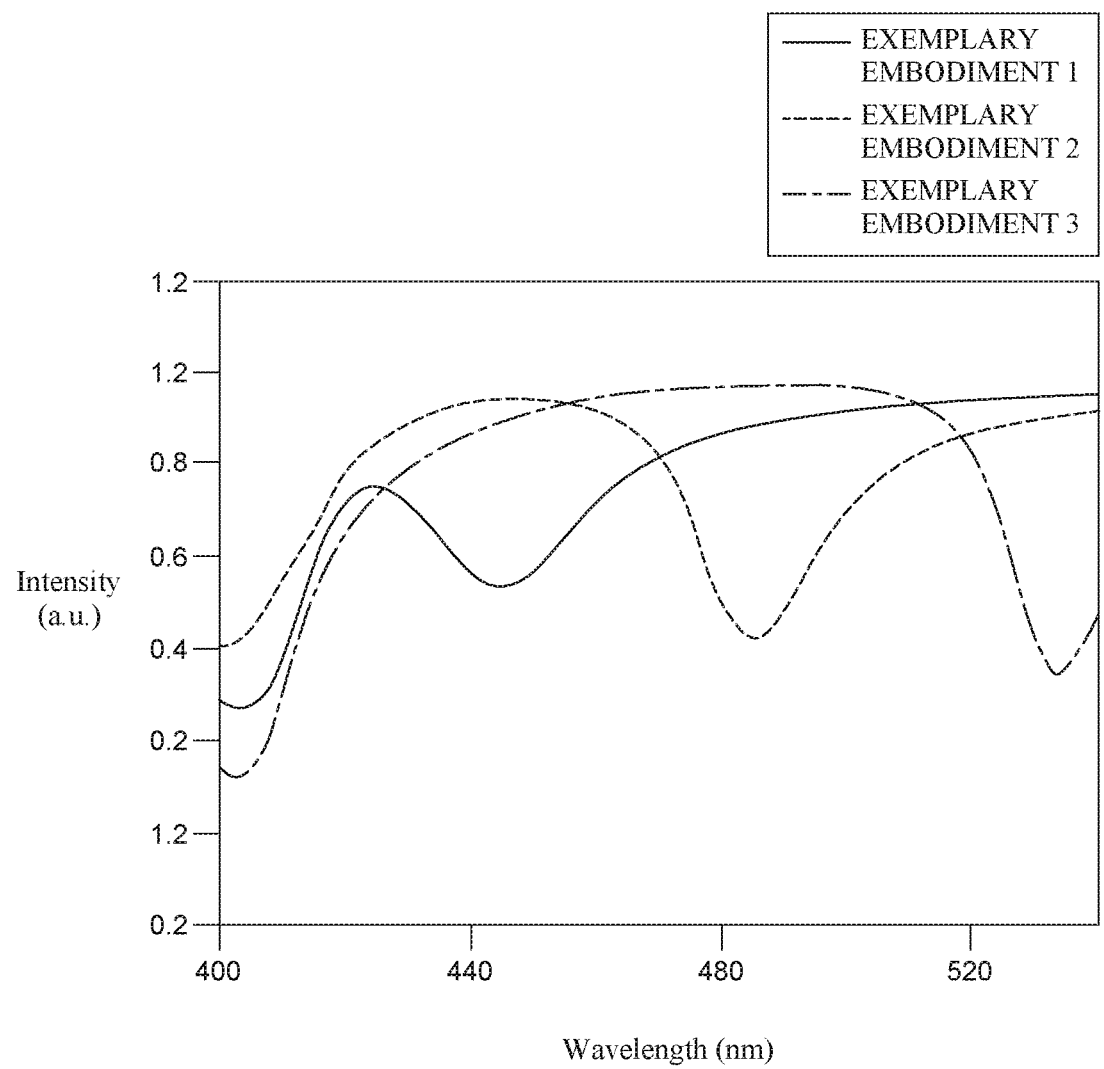

FIG. 7A to FIG. 7C are graphs illustrating light extraction spectra of light emitting display apparatuses according to various exemplary embodiments of the present disclosure. Particularly, FIG. 7A illustrates light extraction simulation results in accordance with the thickness t2 of the second portion 131B2 of the light emitting display apparatus 100 according to an exemplary embodiment of the present disclosure. FIG. 7B illustrates light extraction simulation results in accordance with the thickness t2 of the second portion 131B2 of the light emitting display apparatus 500 according to another exemplary embodiment of the present disclosure. FIG. 7C illustrates light extraction simulation results in accordance with the thickness of the bank layer 514 of the light emitting display apparatus 500 according to another exemplary embodiment of the present disclosure.

In FIGS. 7A to 7C, for simulation, the light emitting display apparatus 100 or 500 according to various exemplary embodiments of the present disclosure was configured to include the overcoating layer 140, the first electrode 131, the light emitting layer 132, and the bank layer 114 or 514, and it was assumed that the side portion of the protrusion portion 142 and the base portion 141 of the overcoating layer 140 form an inclination angle of 60 degrees. FIGS. 7A to 7C show light extraction spectra of light extracted from the side portion of the protrusion portion 142. For example, the spectra illustrated in FIGS. 7A to 7C can be the spectra of light extracted by passing through the bank layer 114 and the second portion 131B2 disposed on the side portion of the protrusion portion 142. The graphs of FIGS. 7A to 7C are the results of experiments obtained by setting the maximum peak value to 1.

First, FIG. 7A illustrates light extraction simulation results in accordance with the thickness t2 of the second portion 131B2 of the light emitting display apparatus 100 according to an exemplary embodiment of the present disclosure. In exemplary embodiments 1 to 9 of the present disclosure, it was assumed that as an element corresponding to the bank layer 114, a polyimide having a refractive index of 1.6 was disposed to have a thickness of 2,200 nm and it was assumed that an indium tin oxide (ITO) having a refractive index of 1.8 was disposed as an element corresponding to the second portion 131B2.

In the exemplary embodiment 1, it was assumed that the thickness t2 of the second portion 131B2 is 5 nm. In the exemplary embodiment 2, it was assumed that the thickness t2 of the second portion 131B2 is 15 nm. In the exemplary embodiment 3, it was assumed that the thickness t2 of the second portion 131B2 is 25 nm. In the exemplary embodiment 4, it was assumed that the thickness t2 of the second portion 131B2 is 35 nm. In the exemplary embodiment 5, it was assumed that the thickness t2 of the second portion 131B2 is 45 nm. In the exemplary embodiment 6, it was assumed that the thickness t2 of the second portion 131B2 is 55 nm. In the exemplary embodiment 7, it was assumed that the thickness t2 of the second portion 131B2 is 65 nm. In the exemplary embodiment 8, it was assumed that the thickness t2 of the second portion 131B2 is 75 nm. In the exemplary embodiment 9, it was assumed that the thickness t2 of the second portion 131B2 is 85 nm.

With reference to FIG. 7A, it could be confirmed that as the thickness t2 of the second portion 131B2 increases from 5 nm to 85 nm, a first peak at which light extraction is minimized shifts to a long wavelength region. When the thickness t2 of the second portion 131B2 is less than 45 nm, the first peak shifts to an extremely short wavelength, and thus, blue light extraction efficiency itself can be significantly reduced, which is a problem. When the thickness t2 of the second portion 131B2 is greater than 75 nm, a second peak formed in a wavelength range shorter than that of the first peak shifts to a long wavelength region, thereby reducing transmission of light in a wavelength range of 440 nm to 480 nm. Therefore, blue light extraction efficiency can be reduced. Therefore, in the light emitting display apparatus 100 according to an exemplary embodiment of the present disclosure, when the inclination angle formed by the side portion of the protrusion portion 142 and the base portion 141 is 60 degrees, the bank layer 114 has a thickness of 2,200 nm, a polyimide having a refractive index of 1.6 is disposed as the bank layer 114, and an indium tin oxide (ITO) having a refractive index of 1.8 is disposed as the second portion 131B2, the thickness t2 of the second portion 131B2 can be set to 45 nm to 75 nm, thereby improving color gamut characteristics, simultaneously with improving extraction efficiency of blue light.

FIG. 7B illustrates light extraction simulation results in accordance with the thickness t2 of the second portion 131B2 of the light emitting display apparatus 500 according to another embodiment of the present invention. Exemplary embodiments of FIG. 7B are different from those of FIG. 7A in terms of the bank layer 514, and other configurations thereof are substantially the same as those of FIG. 7A. Thus, a redundant description will be omitted or will be brief.

FIG. 7B illustrates light extraction simulation results in accordance with the exemplary embodiment 1 to the exemplary embodiment 5 of the present disclosure. In the exemplary embodiments 1 to 5, it was assumed that as an element corresponding to the bank layer 514, a silicon nitride (SiNx) having a refractive index of 1.85 was disposed to have a thickness of 1,000 nm and it was assumed that an indium tin oxide (ITO) having a refractive index of 1.8 was disposed as an element corresponding to the silicon nitride (SiNx).

In the exemplary embodiment 1, it was assumed that the thickness t2 of the second portion 131B2 is 5 nm. In the exemplary embodiment 2, it was assumed that the thickness t2 of the second portion 131B2 is 15 nm. In the exemplary embodiment 3, it was assumed that the thickness t2 of the second portion 131B2 is 25 nm. In the exemplary embodiment 4, it was assumed that the thickness t2 of the second portion 131B2 is 35 nm. In the exemplary embodiment 5, it was assumed that the thickness t2 of the second portion 131B2 is 45 nm. With reference to FIG. 7B, it could be confirmed that as the thickness t2 of the second portion 131B2 increases from 5 nm to 45 nm, a wavelength at which light extraction is minimized shifts to a long wavelength region. When the thickness t2 of the second portion 131B2 is less than 5 nm, the wavelength at which light extraction is minimized shifts to an extremely short wavelength, and thus, blue light extraction efficiency itself can be significantly reduced, which is a problem. Therefore, in the light emitting display apparatus 500 according to another exemplary embodiment of the present disclosure, when the inclination angle formed by the side portion of the protrusion portion 142 and the base portion 141 is 60 degrees, the bank layer 514 has a thickness of 1,000 nm, a silicon nitride (SiNx) having a refractive index of 1.85 is disposed as the bank layer 514, and an indium tin oxide (ITO) having a refractive index of 1.8 is disposed as the second portion 131B2, the thickness t2 of the second portion 131B2 can be set to 5 nm to 25 nm, thereby improving color gamut characteristics, simultaneously with improving extraction efficiency of blue light.

FIG. 7C illustrates light extraction simulation results in accordance with the thickness of the bank layer 514 of the light emitting display apparatus 500 according to another exemplary embodiment of the present disclosure. Exemplary embodiments of FIG. 7C are different from those of FIG. 7B in terms of the bank layer 514 and the second portion 131B2, but other configurations thereof are substantially the same as those of FIG. 7B. Thus, a redundant description will be omitted or will be brief.

FIG. 7C shows light extraction simulation results of transmittance according to wavelengths of light in the exemplary embodiment 1 to the exemplary embodiment 3. In the exemplary embodiments 1 to 3, it was assumed that as an element corresponding to the second portion 131B2, an indium tin oxide (ITO) having a refractive index of 1.8 was disposed to have a thickness of 15 nm and it was assumed that a silicon nitride (SiNx) having a refractive index of 1.85 was disposed as an element corresponding to the bank layer 514.

In the exemplary embodiment 1, it was assumed that the thickness of the bank layer 514 is 1000 nm. In the exemplary embodiment 2, it was assumed that the thickness of the bank layer 514 is 1500 nm. In the exemplary embodiment 3, it was assumed that the thickness of the bank layer 514 is 2000 nm. With reference to FIG. 7C, it could be confirmed that as the thickness of the bank layer 514 increases from 1000 nm to 2000 nm, a wavelength at which light extraction is minimized shifts to a long wavelength region. When the thickness of the bank layer 514 is 1000 nm, the wavelength at which light extraction is minimized shifts to an extremely short wavelength, and thus, blue light extraction efficiency itself can be significantly reduced, which is a problem. When the thickness of the bank layer 514 is 2000 nm, the wavelength at which light extraction is minimized shifts to an extremely long wavelength, so that reflectance of light in a wavelength range of 480 nm to 500 nm may not be reduced. Therefore, in the light emitting display apparatus 500 according to another exemplary embodiment of the present disclosure, when the inclination angle formed by the side portion of the protrusion portion 142 and the base portion 141 is 60 degrees, an indium tin oxide (ITO) having a thickness of 15 nm and a refractive index of 1.8 is disposed as the second portion 131B2, and a silicon nitride (SiNx) having a refractive index of 1.85 is disposed as the bank layer 514, the thickness of the bank layer 514 can be set to 1000 nm to 2000 nm, thereby improving color gamut characteristics, simultaneously with improving extraction efficiency of blue light.

A light emitting display apparatus according to one or more embodiments of the present disclosure will be described below.

A light emitting display apparatus according to an embodiment of the present disclosure comprises a substrate including a plurality of sub-pixels; an overcoating layer on the substrate and having a base portion and a protrusion portion; a first electrode disposed to cover a side portion of the protrusion portion and the base portion at the plurality of sub-pixels; a bank layer covering a portion of the first electrode and the overcoating layer; and a light emitting layer and a second electrode on the first electrode and the bank layer at the plurality of sub-pixels, wherein the first electrode includes a reflective layer and a transparent conductive layer on the reflective layer, the transparent conductive layer includes a first portion on the base portion and a second portion on a side surface of the protrusion portion, and a thickness of the second portion is greater than a thickness of the first portion.

According to some embodiments of the present disclosure, the thickness of the second portion can be a vertical distance between a lower surface of the second portion in contact with the reflective layer and an upper surface of the second portion in contact with the bank layer.

According to some embodiments of the present disclosure, the plurality of sub-pixels can include a red sub-pixel, a green sub-pixel and a blue sub-pixel, and the transparent conductive layer can be disposed in the blue sub-pixel.

According to some embodiments of the present disclosure, the bank layer can be formed of an inorganic material.

According to some embodiments of the present disclosure, the transparent conductive layer can further comprise a third portion on an upper surface of the protrusion portion, a thickness of the third portion can be identical to the thickness of the first portion or the thickness of the second portion.

According to some embodiments of the present disclosure, the protrusion portion can include one or more uneven portion on the upper surface of the protrusion portion.

According to some embodiments of the present disclosure, the thickness of the third portion on the uneven portion can be identical to the thickness of the second portion.

According to some embodiments of the present disclosure, the light emitting layer can be disposed separately in each of the plurality of sub-pixels, and a thickness of the light emitting layer can have a value to be configured to have a micro-cavity at each of the plurality of sub-pixels.

A light emitting display apparatus according to an embodiment of the present disclosure comprises a substrate having a plurality of sub-pixels, the plurality of sub-pixels including a light emitting area and a non-light emitting area; an overcoating layer having a protrusion portion protruding from the non-light emitting area; a light emitting element including a first electrode being in contact with the protrusion portion, a second electrode, and a light emitting layer at the light emitting area between the first electrode and the second electrode; and a bank layer covering a portion of the first electrode and the protrusion portion, wherein the first electrode includes a reflective layer and a transparent conductive layer on the reflective layer, the transparent conductive layer includes a first transparent conductive layer at the light emitting area and a second transparent conductive layer disposed on the protrusion portion in the non-light emitting area, and a thickness of the second transparent conductive layer is greater than a thickness of the first transparent conductive layer.

According to some embodiments of the present disclosure, the thickness of the second transparent conductive layer and the thickness of the first transparent conductive layer are configured to reduce occurrence of a change in color coordinates due to light reflected and extracted by the reflective layer disposed on the protrusion portion.

According to some embodiments of the present disclosure, the plurality of sub-pixels can include a red sub-pixel, a green sub-pixel and a blue sub-pixel, and the first transparent conductive layer and the second transparent conductive layer can be disposed at the blue sub-pixel.

According to some embodiments of the present disclosure, the first transparent conductive layer and the second transparent conductive layer can include a same material.

According to some embodiments of the present disclosure, the first transparent conductive layer and the second transparent conductive layer can be integrally provided.

According to some embodiments of the present disclosure, the second transparent conductive layer can include a material having a refractive index different from a refractive index of the bank layer.

According to some embodiments of the present disclosure, the second transparent conductive layer can include a lower layer and an upper layer on the lower layer.

According to some embodiments of the present disclosure, the upper layer can include a material having a refractive index different from a refractive index of the lower layer.

According to some embodiments of the present disclosure, the bank layer can include an organic material, a thickness of the bank layer can be 2,200 nm, and the thickness of the second transparent conductive layer can be 45 nm to 75 nm.

According to some embodiments of the present disclosure, the bank layer can include an inorganic material, the thickness of the second transparent conductive layer can be 5 nm to 25 nm.

According to some embodiments of the present disclosure, the bank layer can have a thickness of 1000 nm to 2000 nm.

A light emitting display apparatus according to an embodiment of the present disclosure comprises an overcoating layer on a substrate and having a base portion and a protrusion portion protruding from the base portion, a first electrode disposed to cover a side portion of the protrusion portion and the base portion, the first electrode includes a reflective layer and a transparent conductive layer on the reflective layer, a bank layer covering a portion of the first electrode and the overcoating layer, and a light emitting layer and a second electrode on the first electrode and the bank layer.

According to some embodiments of the present disclosure, a thickness of the transparent conductive layer on the base portion of the overcoating layer is equal to a thickness of the transparent conductive layer on the protrusion portion of the overcoating layer.

It will be apparent to those skilled in the art that various modifications and variations can be made in the present disclosure without departing from the technical idea or scope of the disclosure. Thus, it can be intended that embodiments of the present disclosure cover the modifications and variations of the disclosure provided they come within the scope of the appended claims and their equivalents.

What is claimed is:
1. A light emitting display apparatus, comprising:
a substrate including a plurality of sub-pixels;

an overcoating layer on the substrate and having a base portion and a protrusion portion;

a first electrode disposed to cover a side portion of the protrusion portion and the base portion at the plurality of sub-pixels;

a bank layer covering a portion of the first electrode and the overcoating layer; and a light emitting layer and a second electrode on the first electrode and the bank layer at the plurality of sub-pixels, wherein the first electrode includes a reflective layer and a transparent conductive layer on the reflective layer, wherein the transparent conductive layer includes a first portion on the base portion, a second portion on a side surface of the protrusion portion, and a third portion disposed on an upper surface of the protrusion portion of the overcoating layer, wherein a thickness of the second portion of the transparent conductive layer is greater than a thickness of the first portion of the transparent conductive layer, wherein the protrusion portion includes one or more uneven portions on the upper surface of the protrusion portion, wherein the side portion of the protrusion portion has a planar surface, and wherein the third portion of the transparent conductive layer of the first electrode is disposed along a shape of the one or more uneven portions on the upper surface of the protrusion portion of the overcoating layer, and an upper surface of the third portion of the transparent conductive layer of the first electrode includes a concave portion.

2. The light emitting display apparatus of claim 1, wherein the thickness of the second portion is a vertical distance between a lower surface of the second portion in contact with the reflective layer and an upper surface of the second portion in contact with the bank layer.

3. The light emitting display apparatus of claim 1, wherein the plurality of sub-pixels include a red sub-pixel, a green sub-pixel and a blue sub-pixel, and wherein the transparent conductive layer is disposed at the blue sub-pixel.

4. The light emitting display apparatus of claim 1, wherein the bank layer is formed of an inorganic material.

5. The light emitting display apparatus of claim 1, wherein a thickness of the third portion is identical to the thickness of the first portion or the thickness of the second portion.

6. The light emitting display apparatus of claim 1, wherein a thickness of the third portion of the transparent conductive layer on the one or more uneven portions is identical to the thickness of the second portion of the transparent conductive layer, wherein the thickness of the second portion of the transparent conductive layer and the thickness of the third portion of the transparent conductive layer are both greater than the thickness of the first portion of the transparent conductive layer, and wherein the second portion of the transparent conductive layer and the third portion of the transparent conductive layer are both disposed in a non-light emitting area, and the first portion of the transparent conductive layer is disposed in a light emitting area.

7. The light emitting display apparatus of claim 1, wherein the light emitting layer is disposed separately at each of the plurality of sub-pixels, and a thickness of the light emitting layer has a value corresponding to a micro-cavity at each of the plurality of sub-pixels.

8. The light emitting display apparatus of claim 1, wherein the third portion of the transparent conductive layer of the first electrode disposed along the shape of the one or more uneven portions is located higher than the light emitting layer with respect to the substrate.

9. A light emitting display apparatus, comprising:

a substrate having a plurality of sub-pixels, the plurality of sub-pixels including a light emitting area and a non-light emitting area;

an overcoating layer having a protrusion portion protruding from the non-light emitting area;

a light emitting element including a first electrode being in contact with the protrusion portion, a second electrode, and a light emitting layer at the light emitting area between the first electrode and the second electrode; and a bank layer covering a portion of the first electrode and the protrusion portion, wherein the first electrode includes a reflective layer and a transparent conductive layer on the reflective layer, wherein the transparent conductive layer includes a first transparent conductive layer at the light emitting area and a second transparent conductive layer on the protrusion portion at the non-light emitting area, wherein a thickness of the second transparent conductive layer is greater than a thickness of the first transparent conductive layer, wherein the protrusion portion protruding from the non-light emitting area includes one or more uneven portions on an upper surface of the protrusion portion, wherein a side portion of the protrusion portion has a planar surface, and wherein an upper surface of the second transparent conductive layer of the first electrode includes a concave portion in an area corresponding to the one or more uneven portions on the upper surface of the protrusion portion of the overcoating layer.

10. The light emitting display apparatus of claim 9, wherein the thickness of the second transparent conductive layer and the thickness of the first transparent conductive layer are configured to reduce occurrence of a change in color coordinates due to light reflected and extracted by the reflective layer disposed on the protrusion portion.

11. The light emitting display apparatus of claim 10, wherein the second transparent conductive layer includes a material having a refractive index different from a refractive index of the bank layer.

12. The light emitting display apparatus of claim 9, wherein the plurality of sub-pixels include a red sub-pixel, a green sub-pixel and a blue sub-pixel, and wherein the first transparent conductive layer and the second transparent conductive layer are disposed at the blue sub-pixel.

13. The light emitting display apparatus of claim 9, wherein the first transparent conductive layer and the second transparent conductive layer include a same material.

14. The light emitting display apparatus of claim 9, wherein the first transparent conductive layer and the second transparent conductive layer are integrally provided.

15. The light emitting display apparatus of claim 9, wherein the second transparent conductive layer includes a lower layer and an upper layer on the lower layer.

16. The light emitting display apparatus of claim 15, wherein the upper layer includes a material having a refractive index different from a refractive index of the lower layer.

17. The light emitting display apparatus of claim 9, wherein the bank layer includes an organic material, a thickness of the bank layer is approximately 2,200 nm, and the thickness of the second transparent conductive layer is approximately 45 nm to 75 nm.

18. The light emitting display apparatus of claim 9, wherein the bank layer includes an inorganic material, the thickness of the second transparent conductive layer is approximately 5 nm to 25 nm.

19. The light emitting display apparatus of claim 18, wherein the bank layer has a thickness of approximately 1000 nm to 2000 nm.

20. A light emitting display apparatus, comprising:
an overcoating layer on a substrate and having a base portion and a protrusion portion protruding from the base portion;
a first electrode disposed to cover a side portion of the protrusion portion and the base portion, wherein the first electrode includes a reflective layer and a transparent conductive layer on the reflective layer;
a bank layer covering a portion of the first electrode and the overcoating layer; and
a light emitting layer and a second electrode on the first electrode and the bank layer,
wherein the protrusion portion includes one or more uneven portions on an upper surface of the protrusion portion,
wherein the side portion of the protrusion portion has a planar surface, and
wherein an upper surface of the transparent conductive layer of the first electrode includes a concave portion in an area corresponding to the one or more uneven portions on the upper surface of the protrusion portion of the overcoating layer.

21. The light emitting display apparatus of claim 20, wherein a thickness of the transparent conductive layer on the base portion of the overcoating layer is equal to a thickness of the transparent conductive layer on the protrusion portion of the overcoating layer.

* * * * *